US008502902B2

(12) United States Patent
Kurokawa et al.

(10) Patent No.: US 8,502,902 B2
(45) Date of Patent: Aug. 6, 2013

(54) SEMICONDUCTOR DEVICE

(75) Inventors: Yoshiyuki Kurokawa, Kanagawa (JP);
Takayuki Ikeda, Kanagawa (JP);
Hikaru Tamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 161 days.

(21) Appl. No.: 13/039,672

(22) Filed: Mar. 3, 2011

(65) Prior Publication Data
US 2011/0221945 A1 Sep. 15, 2011

(30) Foreign Application Priority Data
Mar. 11, 2010 (JP) ................................ 2010-054006

(51) Int. Cl.
*H04N 5/222* (2006.01)

(52) U.S. Cl.
USPC ............. 348/333.01; 348/333.02; 348/333.03

(58) Field of Classification Search
USPC ................ 348/333.01–333.09; 345/207, 175; 250/208.1; 257/290–292
See application file for complete search history.

(56) References Cited

U.S. PATENT DOCUMENTS

| | | | |
|---|---|---|---|
| 6,747,638 B2 | 6/2004 | Yamazaki et al. | |
| 7,123,243 B2 | 10/2006 | Kawasaki et al. | |
| 7,522,149 B2 | 4/2009 | Nakamura et al. | |
| 7,525,523 B2 | 4/2009 | Yamazaki et al. | |
| 7,586,479 B2 | 9/2009 | Park et al. | |
| 7,652,658 B2 | 1/2010 | Nishi et al. | |
| 7,737,478 B2 | 6/2010 | Yanagisawa et al. | |
| 7,800,594 B2 | 9/2010 | Nakamura et al. | |
| 2009/0295769 A1 | 12/2009 | Yamazaki et al. | |
| 2010/0007632 A1 | 1/2010 | Yamazaki | |
| 2010/0085331 A1 | 4/2010 | Kurokawa et al. | |
| 2010/0090996 A1* | 4/2010 | Chou et al. ..................... | 345/207 |
| 2010/0097354 A1* | 4/2010 | Ahn et al. ..................... | 345/175 |
| 2010/0134534 A1* | 6/2010 | Seesselberg et al. ......... | 345/690 |
| 2010/0156850 A1 | 6/2010 | Kurokawa | |
| 2010/0156851 A1 | 6/2010 | Kurokawa | |
| 2010/0225617 A1 | 9/2010 | Yoshimoto et al. | |

(Continued)

FOREIGN PATENT DOCUMENTS

CN 101634764 A 1/2010
EP 2177946 A2 4/2010

(Continued)

OTHER PUBLICATIONS

International Search Report (Application No. PCT/JP2011/054058) dated Mar. 29, 2011, in English.
Written Opinion (Application No. PCT/JP2011/054058) dated Mar. 29, 2011, in English.

*Primary Examiner* — Yogesh Aggarwal
(74) *Attorney, Agent, or Firm* — Fish & Richardson P.C.

(57) ABSTRACT

A semiconductor device obtains highly accurate image data regardless of the intensity of incident light. The semiconductor device includes a first photo sensor provided in a pixel, a second photo sensor provided around the pixel, and a controller for setting the drive condition of the first photo sensor in accordance with the intensity of outside light obtained by the second photo sensor. An image is taken after the sensitivity of the first photo sensor is changed in accordance with the drive condition set by the controller. Thus, in the semiconductor device, an image can be taken using the first photo sensor whose sensitivity is optimized in accordance with the intensity of incident light.

19 Claims, 17 Drawing Sheets

| U.S. PATENT DOCUMENTS | | |
|---|---|---|
| 2010/0283765 A1 | 11/2010 | Gotoh et al. |
| 2011/0096047 A1 | 4/2011 | Endo |
| 2011/0122098 A1 | 5/2011 | Kurokawa |
| 2011/0122108 A1 | 5/2011 | Kozuma et al. |
| 2011/0205209 A1 | 8/2011 | Kurokawa et al. |

| FOREIGN PATENT DOCUMENTS | | |
|---|---|---|
| JP | 2001292276 A | 10/2001 |
| JP | 2006091462 A | 4/2006 |
| JP | 2008287061 A | 11/2008 |

* cited by examiner

SEMICONDUCTOR DEVICE

TECHNICAL FIELD

The present invention relates to semiconductor devices and a method for driving the semiconductor devices. In particular, the present invention relates to semiconductor devices including photo sensors and a driving method thereof.

BACKGROUND ART

Solid-state image sensors, for example, image sensors have been used for taking images. Further, in recent years, touch panels with input functions obtained by making display devices have image pickup functions have attracted attention. Touch panels are display devices which can be operated when fingers or the like directly touch panels. The touch panels are also referred to as touch screens, for example.

In order to make display devices have image pickup functions, photo sensors are provided in display regions. Thus, the display regions can also serve as input regions. For example, Reference 1 discloses a semiconductor device with an image capture function.

REFERENCE

[Reference 1] Japanese Published Patent Application No. 2001-292276

DISCLOSURE OF INVENTION

A semiconductor device in which an image is taken using a photo sensor has a problem in that incident light affects the accuracy of image pickup in the semiconductor device when the intensity of the incident light is too high or too low depending on a usage environment or the like. When the accuracy of image pickup is decreased, image pickup defects such as false recognition of a detection position and blur of a captured image (image data) easily occur. In particular, the semiconductor device is likely to have the problems when it is affected by light from the outside (outside light).

In view of the problems, an object is to provide a semiconductor device in which image pickup defects due to a usage environment are prevented. Alternatively, an object is to provide a driving method of a semiconductor device in which image pickup defects due to a usage environment are prevented.

Alternatively, an object is to provide a semiconductor device which can obtain highly accurate image data regardless of the intensity of incident light. Alternatively, an object is to provide a driving method of a semiconductor device which can obtain highly accurate image data regardless of the intensity of incident light.

One embodiment of the present invention is a semiconductor device which includes a first photo sensor provided in a pixel, a second photo sensor provided around the pixel, and a controller for setting the drive condition of the first photo sensor in accordance with the intensity of outside light obtained by the second photo sensor. An image is taken after the sensitivity of the first photo sensor is changed in accordance with the drive condition set by the controller. Thus, in the semiconductor device, an image can be taken using the first photo sensor whose sensitivity is optimized in accordance with the intensity of incident light.

In the semiconductor device, a drive timing signal and drive voltage can be set as the drive condition of the first photo sensor.

One embodiment of the present invention is a semiconductor device which includes a first photo sensor provided in a pixel, a second photo sensor provided around the pixel, and a controller for setting the drive condition of the first photo sensor in accordance with the intensity of outside light obtained by the second photo sensor. The controller includes a first register, a translation table, a CPU, a first memory, a timing controller, and a power supply circuit. The timing controller includes a second register. The power supply circuit includes a third register. The first register stores data of the intensity of the outside light obtained by the second photo sensor. The translation table stores data for specifying the drive condition of the first photo sensor in accordance with the intensity of outside light. In accordance with a command of a program stored in the first memory, the CPU generates data to be stored in the second register and data to be stored in the third register with the use of the data stored in the first register and the data stored in the translation table. The timing controller generates a drive timing signal of the first photo sensor with the use of the data stored in the second register. The power supply circuit generates drive voltage of the first photo sensor with the use of the data stored in the third register. An image is taken after the sensitivity of the first photo sensor is changed in accordance with the drive timing signal and the drive voltage set by the controller.

One embodiment of the present invention is a semiconductor device which includes a first photo sensor provided in a pixel, a second photo sensor provided around the pixel, and a controller for setting the drive condition of the first photo sensor in accordance with the intensity of outside light obtained by the second photo sensor. The controller includes a first register, a translation table, a CPU, a first memory, a second memory, a timing controller, and a power supply circuit. The timing controller includes a second register. The power supply circuit includes a third register. The first register stores data of the intensity of the outside light obtained by the second photo sensor. The translation table stores data for specifying the drive condition of the first photo sensor in accordance with the intensity of outside light. In accordance with a command of a program stored in the first memory, the CPU executes the program with the use of the second memory and generates data to be stored in the second register and data to be stored in the third register with the use of the data stored in the first register and the data stored in the translation table. The timing controller generates a drive timing signal of the first photo sensor with the use of the data stored in the second register. The power supply circuit generates drive voltage of the first photo sensor with the use of the data stored in the third register. An image is taken after the sensitivity of the first photo sensor is changed in accordance with the drive timing signal and the drive voltage set by the controller.

In the semiconductor device, the power supply circuit includes a D/A converter and an amplifier in addition to the third register, and the data stored in the third register is converted into voltage output by the D/A converter and is amplified by the amplifier so as to be used as the drive voltage of the first photo sensor.

In the semiconductor device, the pixel can include a display element and have an image pickup function and a display function.

Note that in this specification, a high potential is also simply referred to as "H" or "high". Further, a low potential is also simply referred to as "L" or "low".

In addition, in this specification and the like, terms such as "electrode" and "wiring" do not limit the functions of components. For example, an "electrode" can be used as part of a "wiring", and the "wiring" can be used as part of the "electrode". The terms such as "electrode" and "wiring" can also mean a combination of a plurality of "electrodes" and a plurality of "wirings", for example.

Functions of a "source" and a "drain" might interchange when a transistor of opposite polarity is used or the direction of current flow is changed in circuit operation, for example. Therefore, in this specification, the terms "source" and "drain" can interchange.

Note that in this specification and the like, the term "electrically connected" includes the case where components are connected to each other through an object having any electric function. Here, there is no particular limitation on an object having any electric function as long as electric signals can be transmitted and received between components that are connected to each other through the object. Examples of an "object having any electric function" are a switching element such as a transistor, a resistor, an inductor, a capacitor, and an element with a variety of functions in addition to an electrode and a wiring.

Image pickup defects due to a usage environment can be prevented. Specifically, the semiconductor device can be hardly affected by the intensity of incident light (outside light), and highly accurate image data can be obtained regardless of the intensity of the incident light.

BEST MODE FOR CARRYING OUT THE INVENTION

Figure 1:
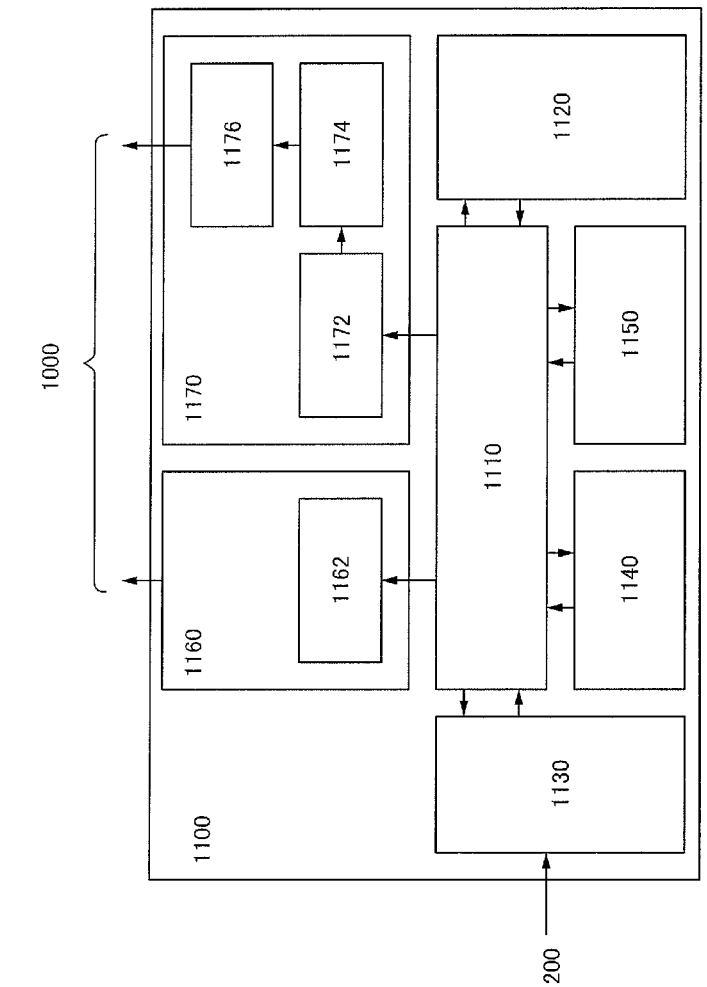
FIG. 1 is a block diagram illustrating an example of a controller.

Embodiments will be described below in detail with reference to the drawings. Note that the embodiments can be implemented in various different ways. It will be readily appreciated by those skilled in the art that modes and details of the embodiments can be changed in various ways without departing from the spirit and scope of the present invention. Therefore, the present invention should not be construed as being limited to the following description of the embodiments. In all the drawings for describing the embodiments, the same portions or portions having similar functions might be denoted by the same reference numerals, and description thereof is not repeated.

Embodiment 1

A semiconductor device in this embodiment has an image pickup function. The semiconductor device includes at least a photo sensor provided in a pixel, a photo sensor provided around the pixel, and a controller. The controller sets the drive condition of the photo sensor provided in the pixel in accordance with the intensity of outside light obtained by the photo sensor provided around the pixel. In the semiconductor device in this embodiment, an image can be taken after the sensitivity of the photo sensor provided in the pixel is changed in accordance with the drive condition set by the controller.

Note that in the following description, the photo sensor provided in the pixel and the photo sensor provided around (outside) the pixel are also referred to as a first photo sensor and a second photo sensor, respectively.

A second photo sensor obtains the intensity of light (outside light) which enters the second photo sensor. The controller changes the drive condition of a first photo sensor in accordance with the intensity of outside light obtained by the second photo sensor. The sensitivity of the first photo sensor is changed in accordance with the drive condition set by the controller.

The sensitivity of the first photo sensor can be changed when a drive condition such as an accumulation period, a read period, or drive voltage is changed. The drive condition such as an accumulation period or a read period can be changed when a drive timing signal is controlled, for example, the interval of start pulses is changed, clock frequency is changed, or a pulse width control signal is changed.

When an image is taken after the sensitivity of the first photo sensor is changed in accordance with the intensity of outside light, highly accurate image data can be obtained with the influence of the outside light curbed.

Next, the semiconductor device in this embodiment is specifically described with reference to FIG. 1.

A controller 1100 with the structure illustrated in FIG. 1 can be used in order to change the sensitivity of a photo sensor provided in a pixel (a first photo sensor 1000) in accordance with the intensity of outside light obtained by a photo sensor provided around the pixel (a second photo sensor 1200). In FIG. 1, the controller 1100 includes a CPU 1110, a program memory 1120, a register 1130 for outside light intensity data, a translation table 1140, a work memory 1150, a timing controller 1160, and a power supply circuit 1170. The timing controller 1160 includes a control data register 1162. The power supply circuit 1170 includes a control data register 1172, a D/A converter 1174, and an amplifier 1176.

Note that although names for expressing functions are used for components in FIG. 1 and the description of the components in order to distinguish the components from each other, the names of the components are not limited to the names for expressing functions. The names of the components can be names with ordinal numbers. In this embodiment, the program memory, the work memory, and the translation table can be referred to as a first memory, a second memory, and a third memory, respectively. Further, the register for outside light intensity data, the control data register included in the timing controller, and the control data register included in the power supply circuit can be referred to as a first register, a second register, and a third register, respectively.

In accordance with a command of a program stored in the program memory 1120, the CPU 1110 generates data to be stored in the control data register 1162 included in the timing controller 1160 and data to be stored in the control data register 1172 included in the power supply circuit 1170 with the use of data stored in the register 1130 for outside light intensity data and data stored in the translation table 1140. Note that the work memory 1150 can be used as a memory space which is necessary to execute the command of the program.

In the case where the CPU 1110 is a von Neumann architecture CPU, the program memory 1120, the register 1130 for outside light intensity data, the translation table 1140, the control data register 1162, the control data register 1172, and the work memory 1150 can be in the same address space as the CPU 1110 in software. In other words, the program memory 1120, the register 1130 for outside light intensity data, the translation table 1140, the control data register 1162, the control data register 1172, and the work memory 1150 can be regarded as data regions with specified addresses in the software. Therefore, when the CPU 1110 reads data from the program memory 1120, the register 1130 for outside light intensity data, the translation table 1140, the control data register 1162, the control data register 1172, or the work memory 1150, data is read from the specified address in the software. When the CPU 1110 stores data in the program memory 1120, the register 1130 for outside light intensity data, the translation table 1140, the control data register 1162, the control data register 1172, or the work memory 1150, data is stored in the specified address in the software.

In the case where the CPU 1110 is a Harvard architecture CPU, the program memory 1120 can be in a program address space, and the register 1130 for outside light intensity data, the translation table 1140, the control data register 1162, the control data register 1172, and the work memory 1150 can be in a data address space which is different from the program address space. When the program address space and the data address space are distinguished from each other in software, it is possible to access the address spaces efficiently, and the throughput of the CPU 1110 is easily improved.

Note that also in this case, the program memory 1120 can be regarded as a data region with a specified address in the program address space in the software. Further, the register 1130 for outside light intensity data, the translation table 1140, the control data register 1162, the control data register 1172, and the work memory 1150 can be regarded as data regions with specified addresses in the data address space in the software.

In addition, when the CPU 1110 reads data from the program memory 1120, data is read from the specified address in the program address space in the software. Further, when the CPU 1110 reads data from the register 1130 for outside light intensity data, the translation table 1140, the control data register 1162, the control data register 1172, or the work memory 1150, data is read from the specified address in the data address space in the software. When the CPU 1110 stores data in the register 1130 for outside light intensity data, the translation table 1140, the control data register 1162, the control data register 1172, or the work memory 1150, data is stored in the specified address in the data address space in the software.

The register 1130 for outside light intensity data stores data related to the intensity of outside light obtained by the second photo sensor 1200. For example, the register 1130 for outside light intensity data stores digital data related to the intensity of outside light obtained by the second photo sensor 1200.

The translation table 1140 stores data which specifies the drive condition of the first photo sensor 1000 in accordance with the intensity of outside light.

The timing controller 1160 generates a drive timing signal of the first photo sensor 1000 in accordance with data stored in the control data register 1162. Data generated in the CPU 1110 in accordance with the intensity of outside light obtained by the second photo sensor 1200 is stored in the control data register 1162. Therefore, the timing controller 1160 generates the drive timing signal of the first photo sensor 1000 that corresponds to the intensity of the outside light obtained by the second photo sensor 1200.

Note that the drive timing signal can be changed when the timing, pulse width (a period of "high"), or cycle of a clock signal, the timing, pulse width (a period of "high"), or cycle of a start signal, or the timing, pulse width (a period of "high"), or cycle of a pulse width control signal is changed.

The power supply circuit 1170 generates drive voltage of the first photo sensor 1000 in accordance with data stored in the control data register 1172. The control data register 1172 stores data generated in the CPU 1110 in accordance with the intensity of outside light obtained by the second photo sensor 1200. Therefore, the power supply circuit 1170 generates the drive voltage of the first photo sensor 1000 that corresponds to the intensity of the outside light obtained by the second photo sensor 1200.

Here, the D/A converter 1174 converts the data stored in the control data register 1172 into voltage output that is an analog value. A known circuit such as a resistive-type circuit or a capacitive-type circuit can be used for the D/A converter 1174. The amplifier 1176 amplifies the power of the voltage output which is output from the D/A converter 1174. The amplified voltage output is used as the drive voltage of the first photo sensor 1000. The drive voltage includes a reference potential of the first photo sensor 1000, drive voltage of a driver circuit for driving the first photo sensor 1000, and the like.

The semiconductor device in this embodiment takes an image after the sensitivity of the first photo sensor 1000 is changed in accordance with the drive timing signal and the drive voltage. Thus, an image can be taken using the optimized photo sensor (the first photo sensor 1000), so that highly accurate image data can be obtained.

Note that it is preferable that drive conditions where the sensitivity of an optimal photo sensor (the first photo sensor 1000) can be realized at intensities of outside light in a variety of usage environments be obtained in advance and that data which specifies the drive conditions be stored in the translation table 1140. The data can be stored in the translation table 1140 by the CPU 1110.

A first method for storing data in the translation table 1140 is a method for directly storing data to be stored in the control data register 1162 and data to be stored in the control data register 1172 in accordance with data stored in the register 1130 for outside light intensity data. In addition, a second method for storing data in the translation table 1140 is a method for storing parameter data which specifies a function where data stored in the register 1130 for outside light intensity data is used as an independent variable and data to be stored in the control data register 1162 and data to be stored in the control data register 1172 are used as dependent variables.

The first method can be realized as follows. For example, the translation table 1140 includes a memory. The address of the memory (the translation table 1140) is specified by data X stored in the register 1130 for outside light intensity data.

Data Y which should be stored in the control data register 1162 and the control data register 1172 may be stored in a data region which corresponds to the address. Note that the address can be formed with a structure where the data X stored in the register 1130 for outside light intensity data is used as a lower-order bit and an address Z assigned to the control data register 1162 and the control data register 1172 in the address space is used as a higher-order bit. Note that symbols "X" and "Y" are used for the data X and the data Y for convenience of description.

With such a structure, it can be achieved that data to be stored in the control data register 1162 and the control data register 1172 be generated from data stored in the register 1130 for outside light intensity data, only by reading data from the translation table 1140 by CPU 1110 once in software. Thus, the data can be generated easily with the light load on the CPU 1110.

The second method can be realized as follows. For example, the translation table 1140 includes a memory. Data stored in the register 1130 for outside light intensity data is used as an independent variable X, and data to be stored in the control data register 1162 and the control data register 1172 is used as a dependent variable Y. If this relationship can be expressed as the formula Y(X)=A·X+B, parameter data (A, B) is stored in the memory (the translation table 1140). The CPU 1110 reads the data X stored in the register 1130 for outside light intensity data, calculates the formula A·X+B, and stores the calculation results that are used as the data Y in the control data register 1162 and the control data register 1172. Note that although the relationship between X and Y is expressed as a linear function as an example here, the relationship between X and Y can be expressed as a more complicated functional form.

With such a structure, data to be stored in the control data register 1162 and the control data register 1172 can be generated from data stored in the register 1130 for outside light intensity data with higher accuracy. In particular, in the case where the drive condition of the photo sensor (the first photo sensor 1000) is determined with high accuracy based on the wide range of intensities of outside light, the capacitance of a memory used for the translation table 1140 in the case of the second method is smaller than the capacitance of the memory used for the translation table 1140 in the case of the first method.

Note that in the first method and the second method, the memory used for the translation table 1140 is preferably formed using a nonvolatile memory device such as a flash memory. With a nonvolatile memory device, for example, if data is once stored in a memory at the time of shipment of the semiconductor device, it is possible to eliminate the need for repetitive storage of the data every time a user turns off the semiconductor device, which is advantageous.

Alternatively, the memory used for the translation table 1140 may be formed using a volatile memory device such as an SRAM or a DRAM and a nonvolatile memory device such as a flash memory; data stored in a flash memory may be stored in an SRAM or a DRAM when the semiconductor device is started; and the data may be read from the SRAM or the DRAM when the semiconductor device operates.

As described above, in the semiconductor device in this embodiment, the intensity of outside light is obtained by the second photo sensor 1200 provided around the pixel; the controller 1100 changes the drive condition of the first photo sensor 1000 provided in the pixel in accordance with the intensity of outside light obtained by the second photo sensor 1200; and an image is taken after the sensitivity of the first photo sensor 1000 is changed in accordance with the drive condition set by the controller 1100. When the drive condition of the photo sensor provided in the pixel is adjusted in accordance with the intensity of the outside light, an image can be taken after the sensitivity of the photo sensor provided in the pixel is optimized. Therefore, the influence of the intensity of incident light at the time of image pickup can be curbed regardless of the intensity of the incident light depending on a usage environment or the like (e.g., indoors or outdoors). Thus, highly accurate image data can be obtained.

Note that the structure described in this embodiment can be combined with the structure described in any of the other embodiments in this specification as appropriate.

Embodiment 2

In this embodiment, a structure of a controller that is different from the structure in Embodiment 1 is described. Note that components which are the same as those in FIG. 1 are denoted by the same reference numerals, and detailed description of such components is omitted.

Figure 2:
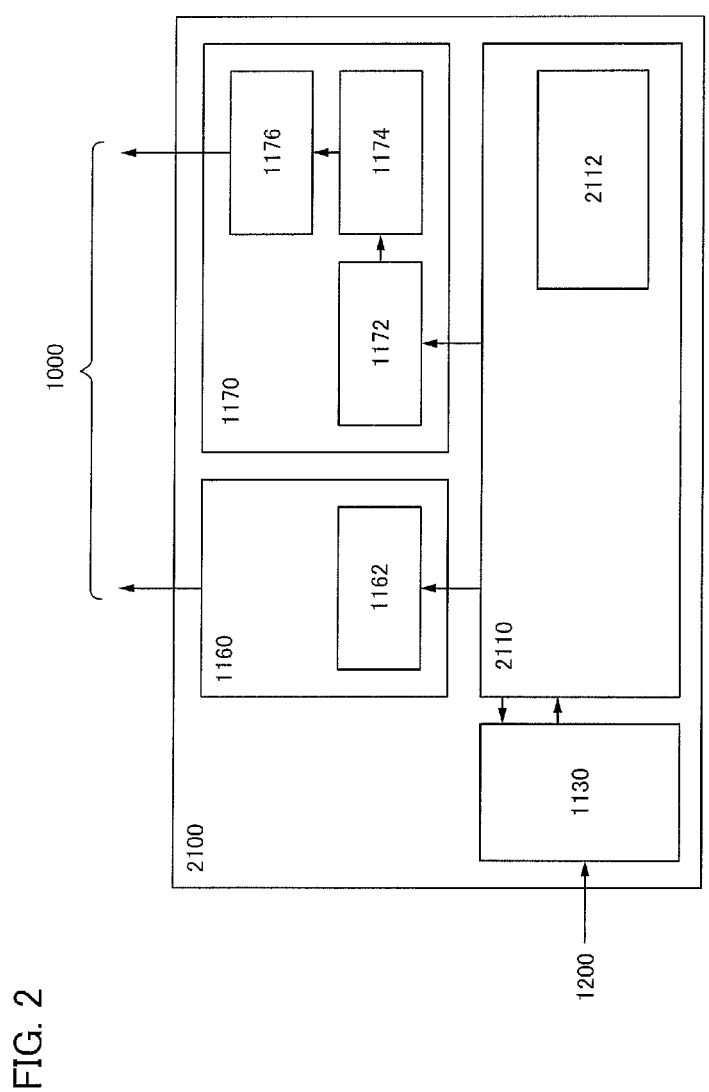
FIG. 2 is a block diagram illustrating an example of a controller.

In this embodiment, the structure of a controller 2100 illustrated in FIG. 2 can be used. In FIG. 2, the controller 2100 includes an exclusive processing circuit 2110, the register 1130 for outside light intensity data, the timing controller 1160, and the power supply circuit 1170. The exclusive processing circuit 2110 includes a translation table 2112. The timing controller 1160 includes the control data register 1162. The power supply circuit 1170 includes the control data register 1172, the D/A converter 1174, and the amplifier 1176.

The structure illustrated in FIG. 2 differs from the structure illustrated in FIG. 1 in that the exclusive processing circuit 2110 including the translation table 2112 is provided instead of the CPU 1110, the program memory 1120, the translation table 1140, and the work memory 1150.

Note that although names for expressing functions are used for components in FIG. 2 and the description of the components in order to distinguish the components from each other, the names of the components are not limited to the expressions of functions, as in the case of FIG. 1 and the description in FIG. 1. The names of the components in FIG. 2 can be names with ordinal numbers. In this embodiment, the register for outside light intensity data, the control data register included in the timing controller, and the control data register included in the power supply circuit can be referred to as a first register, a second register, and a third register, respectively.

The exclusive processing circuit 2110 is a dedicated circuit for generating data to be stored in the control data register 1162 included in the timing controller 1160 and data to be stored in the control data register 1172 included in the power supply circuit 1170 with the use of data stored in the register 1130 for outside light intensity data and data stored in the translation table 2112.

The translation table 2112 stores data which specifies the drive condition of the first photo sensor 1000 in accordance with the intensity of outside light. The translation table 1140 described in Embodiment 1 can be used as the translation table 2112. A method for storing data, and the like are based on Embodiment 1.

As in Embodiment 1, the timing controller 1160 generates a drive timing signal of the first photo sensor 1000 in accordance with control data stored in the control data register 1162. The power supply circuit 1170 generates drive voltage of the first photo sensor 1000 in accordance with data stored in the control data register 1172.

The semiconductor device in this embodiment takes an image after the sensitivity of the first photo sensor 1000 is changed in accordance with the drive timing signal and the drive voltage. Thus, an image can be taken using the optimized photo sensor (the first photo sensor 1000), so that highly accurate image data can be obtained.

As described above, in the semiconductor device in this embodiment, the intensity of outside light is obtained by the second photo sensor 1200 provided around the pixel; the controller 2100 changes the drive condition of the first photo sensor 1000 provided in the pixel in accordance with the intensity of outside light obtained by the second photo sensor 1200; and an image is taken after the sensitivity of the first photo sensor 1000 is changed in accordance with the drive condition set by the controller 2100. When the drive condition of the photo sensor provided in the pixel is adjusted in accordance with the intensity of the outside light, an image can be taken after the sensitivity of the photo sensor provided in the pixel is optimized. Therefore, the influence of the intensity of outside light at the time of image pickup can be curbed. Thus, highly accurate image data can be obtained.

Note that the structure described in this embodiment can be combined with the structure described in any of the other embodiments in this specification as appropriate.

Embodiment 3

In this embodiment, a semiconductor device which includes the controller described in Embodiment 1 or 2 is described. Here, as semiconductor devices, examples of solid-state image sensors (also referred to as image sensors) are described with reference to FIG. 3, FIG. 4, FIG. 5, FIG. 6, and FIG. 7.

The structure of a solid-state image sensor is described with reference to FIG. 3. A solid-state image sensor 300 includes a pixel portion 301, a control circuit portion 331, a controller 311, and a sensor portion 371.

The structure of the controller 1100 illustrated in FIG. 1 in Embodiment 1 or the structure of the controller 2100 described in Embodiment 2 is employed as the structure of the controller 311. The pixel portion 301 includes at least the first photo sensor 1000 described in Embodiment 1 or 2. The sensor portion 371 includes at least the second photo sensor 1200 described in Embodiment 1 or 2.

The pixel portion 301 includes a plurality of pixels 333 arranged in matrix in a row direction and a column direction. The pixel 333 includes a first photo sensor 335 (corresponding to the first photo sensor 1000 described in Embodiment 1 or 2). The first photo sensor 335 can detect an object that is in contact with or close to the pixel portion 301 and can take an image.

The first photo sensor 335 includes a transistor and an element which has a function of generating an electric signal when receiving light. As a specific example of the element which has a function of generating an electric signal when receiving light, there is a photodiode.

The first photo sensor 335 detects an object by determining whether the pixel portion 301 is shaded because outside light is blocked by the object or the outside light enters the pixel portion 301.

The control circuit portion 331 is a circuit for controlling the first photo sensor 335. The control circuit portion 331 includes a photo sensor read circuit 351 on the signal line side and a photo sensor driver circuit 355 on the scan line side. The photo sensor driver circuit 355 on the scan line side has a function of performing reset operation and selection operation which are described later on the first photo sensors 335 included in the pixels provided in a particular row. Further, the photo sensor read circuit 351 on the signal line side has a function of extracting output signals of the first photo sensors 335 included in the pixels in the selected row. Note that the photo sensor read circuit 351 on the signal line side can have a structure in which an output, which is an analog signal, of the photo sensor is extracted as an analog signal to the outside of the solid-state image sensor by an operational amplifier or a structure in which the output is converted into a digital signal by an A/D converter and then extracted to the outside of the solid-state image sensor.

The sensor portion 371 includes at least a second photo sensor (corresponding to the second photo sensor 1200 described in Embodiment 1 or 2). The sensor portion 371 obtains data of the intensity of outside light by the second photo sensor. In addition, in order to transfer the data of the intensity of outside light to the controller 311, the sensor portion 371 preferably includes a variety of processing circuits such as output processing circuits. A photo IC can be used for the sensor portion 371.

Note that the second photo sensor included in the sensor portion 371 can include a transistor and an element which has a function of generating an electric signal when receiving light, as in the case of the first photo sensor 335. As a specific example of the element which has a function of generating an electric signal when receiving light, there is a photodiode.

Next, the circuit diagram of the pixel 333 in the pixel portion 301 is described with reference to FIG. 4. The pixel 333 includes the first photo sensor 335 including a photodiode 344, a transistor 341, and a transistor 342. Further, the pixel includes a first wiring 336 and a second wiring 337 which are connected to the photo sensor read circuit 351 on the signal line side, and a third wiring 338 and a fourth wiring 339 which are connected to the photo sensor driver circuit 355 on the scan line side.

One electrode of the photodiode 344 is electrically connected to the third wiring 338. The other electrode of the photodiode 344 is electrically connected to a gate of the transistor 341. Here, a wiring which electrically connects the photodiode 344 and the gate of the transistor 341 to each other is a gate signal line 343. One of a source and a drain of the transistor 341 is electrically connected to the first wiring 336. The other of the source and the drain of the transistor 341 is electrically connected to one of a source and a drain of the transistor 342. A gate of the transistor 342 is electrically connected to the fourth wiring 339. The other of the source and the drain of the transistor 342 is electrically connected to the second wiring 337.

Figure 5:
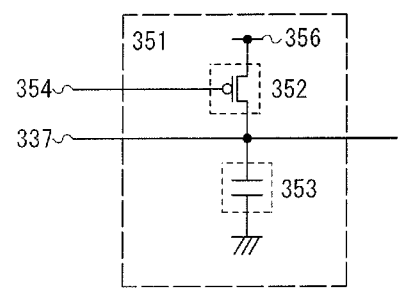
FIG. 5 illustrates a structure of the semiconductor device.

Next, the structure of the photo sensor read circuit 351 is described with reference to FIG. 5. In FIG. 5, the photo sensor read circuit 351 for one column of pixels includes a p-channel transistor 352 and a storage capacitor 353. Further, the photo sensor read circuit 351 includes the second wiring 337 and a fifth wiring 354 in the column of the pixels. The fifth wiring 354 is used for precharge of the second wiring 337 before the photo sensor operates.

Before the first photo sensor 335 in the pixel 333 operates, the potential of the second wiring 337 is set to a reference potential in the photo sensor read circuit 351. In FIG. 5, the potential of the second wiring 337 can be set to a high potential that is the reference potential when the potential of the fifth wiring 354 is "L". The storage capacitor 353 is not necessarily provided in the case where parasitic capacitance of the second wiring 337 is large. Note that the reference potential can be a low potential. In that case, the potential of the second wiring 337 can be set to a low potential that is the reference potential when an n-channel transistor is used instead of the p-channel transistor 352 and the potential of the fifth wiring 354 is "H".

Figure 6:
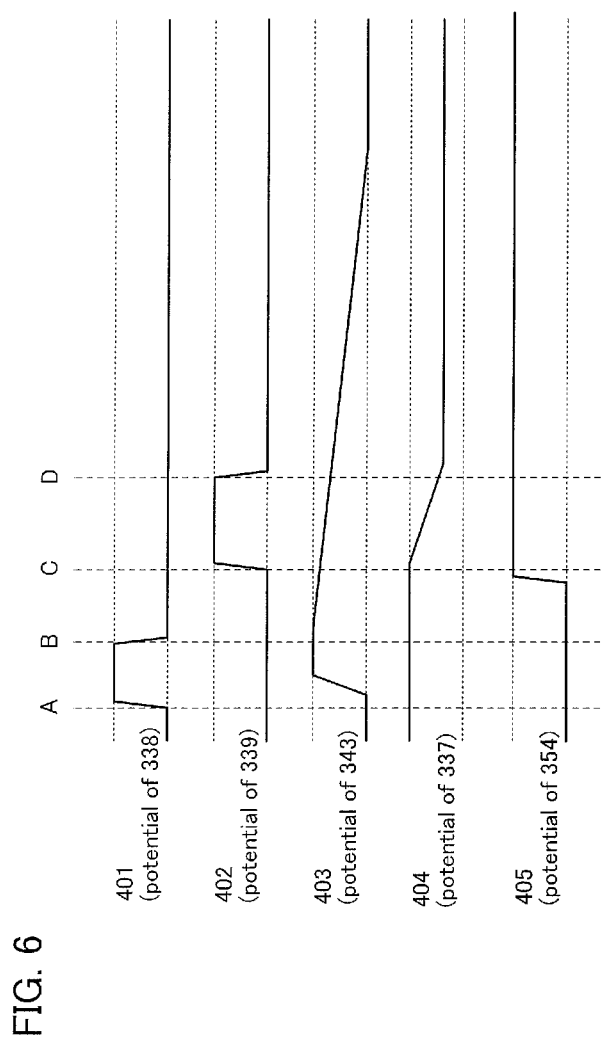
FIG. 6 is a timing chart illustrating operation of the semiconductor device.

Next, the read operation of the first photo sensor 335 in the pixel portion 301 is described with reference to a timing chart in FIG. 6. A signal 401 in FIG. 6 corresponds to the potential of the third wiring 338 in FIG. 4. A signal 402 in FIG. 6 corresponds to the potential of the fourth wiring 339 in FIG. 4. A signal 403 in FIG. 6 corresponds to the potential of the gate signal line 343 to which the gate of the transistor 341 is connected in FIG. 4. A signal 404 in FIG. 6 corresponds to the potential of the second wiring 337 in FIG. 4 and FIG. 5. A signal 405 in FIG. 6 corresponds to the potential of the fifth wiring 354 in FIG. 5.

At a time A, when the potential of the third wiring 338 (the signal 401) is "H" (reset operation), the photodiode 344 is brought into conduction, and the potential of the gate signal line 343 (the signal 403) to which the gate of the transistor 341 is connected is "H". Further, when the potential of the fifth wiring 354 (the signal 405) is "L", the potential of the second wiring 337 (the signal 404) is precharged to "H".

At a time B, when the potential of the third wiring 338 (the signal 401) is "L" (accumulation operation), the potential of the gate signal line 343 (the signal 403) to which the gate of the transistor 341 is connected starts to decrease due to the off-state current of the photodiode 344. The off-state current of the photodiode 344 increases when light is delivered thereto; therefore, the potential of the gate signal line 343 (the signal 403) to which the gate of the transistor 341 is connected varies in accordance with the amount of the light delivered to the photodiode 204. That is, current between the source and the drain of the transistor 341 varies.

At a time C, when the potential of the fourth wiring 339 (the signal 402) is "H" (selection operation), the transistor 342 is turned on, and electrical continuity is established between the first wiring 336 and the second wiring 337 through the transistor 341 and the transistor 342. Then, the potential of the second wiring 337 (the signal 404) is decreased. Note that before the time C, the potential of the fifth wiring 354 (the signal 405) is set to "H" and the precharge of the second wiring 337 is completed. Here, the speed at which the potential of the second wiring 337 (the signal 404) is decreased depends on current flowing between the source and the drain of the transistor 341. That is, the speed varies in accordance with the amount of light delivered to the photodiode 344.

At a time D, when the potential of the fourth wiring 339 (the signal 402) is "L", the transistor 342 is turned off, so that the potential of the second wiring 337 (the signal 404) is constant value after the time D. Here, the value used as the constant value varies in accordance with the amount of light delivered to the photodiode 344. Therefore, the amount of light delivered to the photodiode 344 can be found when the potential of the second wiring 337 is obtained.

As described above, the operation of the first photo sensor 335 in the pixel 333 is realized when reset operation, accumulation operation, and selection operation are repeated. When the reset operation, the accumulation operation, and the selection operation are performed in the photo sensors of all the pixels in the solid-state image sensor, the image of an object to be detected which is in contact with or close to the pixel portion 301 can be taken.

In the case where the intensity of light which enters the pixel portion 301 is too high or too low, the accuracy of image pickup might decrease and the image data might be blurred. Thus, the accuracy of image pickup might decrease and the image data might be blurred due to the influence of the intensity of outside light which depends on a usage environment or the like. Here, the case where the intensity of incident light is adequate, the case where the intensity of incident light is high, and the case where the intensity of incident light is low are described with reference to the histogram of luminance of image data of an object to be detected.

Figure 7:
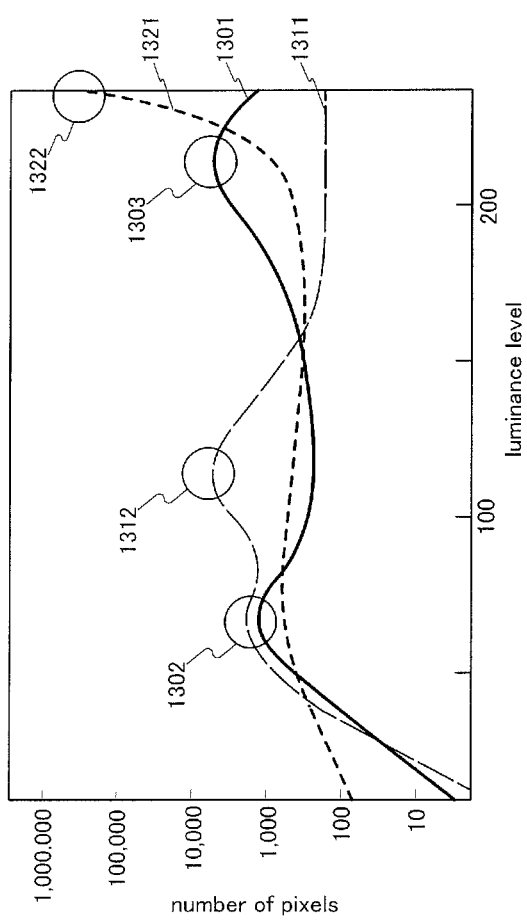
FIG. 7 is a histogram of luminance of image data.

FIG. 7 is the histogram of luminance of image data of an object to be detected. The vertical axis indicates the number of pixels. The horizontal axis indicates the luminance level. The lowest level of luminance is 0, and the highest level of luminance is 255.

A histogram indicated by a solid line 1301 in FIG. 7 illustrates the case where the intensity of incident light is adequate. The solid line 1301 has a peak 1302 indicating the detection position of the object and a peak 1303 indicating positions other than the detection position. The luminance levels of the two peaks are apart from each other. Thus, brightness and darkness of image data are easily distinguished from each other.

A histogram indicated by a broken line 1311 illustrates the case where the intensity of incident light is low. The broken line 1311 has the peak 1302 indicating the detection position of the object and a peak 1312 indicating positions other than the detection position. The luminance levels of the two peaks are close to each other. When the luminance levels of the two peaks are closer to each other, only one peak can be recognized. Therefore, it is difficult to distinguish brightness and darkness of image data from each other. Thus, it is difficult to accurately recognize the object, so that it might be difficult to judge the detection position.

A histogram indicated by a broken line 1321 illustrates the case where the intensity of incident light is high. The broken line 1321 has only a peak 1322 indicating positions other than the detection position. Therefore, it is difficult to distinguish brightness and darkness of image data from each other. Thus, it is difficult to accurately recognize the object, so that it might be difficult to judge the detection position.

As illustrated in FIG. 7, in the case where the intensity of incident light is too low or too high, it is difficult to recognize two peaks of a histogram. Therefore, it is difficult to distinguish brightness and darkness of image data from each other. Thus, it is difficult to accurately recognize an object to be detected, so that it might be difficult to judge a detection position.

Thus, in order to obtain luminance levels of two peaks that are apart from each other as illustrated in the histogram indicated by the solid line 1301 in FIG. 7, the solid-state image sensor 300 in this embodiment obtains the intensity of outside light with the use of the sensor portion 371 provided around (outside) the pixel portion 301 and changes the sensitivity of the first photo sensor 335 by the controller 311 in accordance with the intensity of outside light. Optimization is performed when the intensity of outside light is obtained with the use of the sensor portion 371 and the sensitivity of the first photo sensor 335 is changed by the controller 311 in accordance with the intensity of outside light. An image is taken using the optimized first photo sensor 335. Thus, it is possible to realize the solid-state image sensor 300 which can suppress the influence of the intensity of outside light which depends on a usage environment or the like to a minimum and which can obtain image data with high accuracy.

Figure 4:
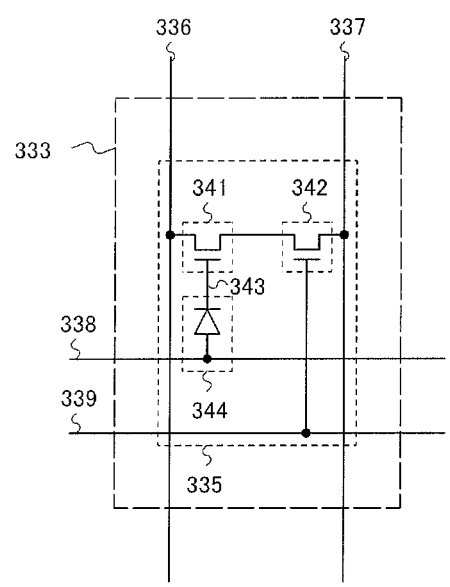
FIG. 4 illustrates a circuit structure of a pixel in the semiconductor device.

As specific methods for changing the sensitivity of the photo sensor, in the structure of FIG. 4, the following methods can be given; a first method by which the potential of the third wiring 338 (the signal 401) is changed and then voltage applied to the photodiode 344, i.e., voltage applied to the gate of the transistor 341 (the signal 403) is changed; a second method by which a difference between the potential of the first wiring 336 and the potential of the sixth wiring 356 is changed and then voltage applied between the source and the drain of the transistor 341 is changed; and a third method by which time taken to perform the accumulation operation of the first photo sensor 335 (accumulation time: time between the time B to the time C) is changed. Further, it is effective to change the sensitivity of the photo sensor by the combination of these methods. The potential of each wiring and the time taken to perform the accumulation operation of the photo sensor in the first to third methods are changed by the controller 311. Specifically, the structure described in Embodiment 1 or 2 is employed as the structure of the controller 311.

In the first method, voltage applied to the photodiode 344 is increased, so that capacity for accumulating electrical charges is increased; thus, the sensitivity of the first photo sensor 335 is improved. In the second method, voltage between the source and the drain of the transistor 341 is increased, so that capacity for accumulating electrical charges is increased; thus, the sensitivity of the first photo sensor 335 is improved. Then, in the third method, accumulation time is made longer, so that time taken to accumulate electrical charges becomes longer; thus, the sensitivity of the first photo sensor 335 is improved. By the first to third methods, even under a usage environment in which the intensity of incident light is low, the sensitivity of the photo sensor and the accuracy of image pickup can be improved. In addition, under a usage environment in which the intensity of incident light is high, operation for the processing may be reversely performed to decrease the sensitivity of the first photo sensor 335, so that the accuracy of image pickup can be improved.

Further, the solid-state image sensor including the photo sensor provided in the pixel can detect an object not only when the object is in contact with the pixel portion but also when the object is not in contact with the pixel portion. However, in the case of the object which is not in contact with the pixel portion, it is difficult to distinguish brightness and darkness from each other because the shadow of the object is faded as the object is apart from the pixel portion. Thus, it is more difficult to detect the object which is not in contact with the pixel portion as compared to the object which is in contact with the pixel portion. Therefore, when the sensitivity of the photo sensor provided in the pixel is improved by the first to third methods, high-resolution image data can be obtained from the object which is not in contact with the pixel portion.

Note that the structure described in this embodiment can be combined with the structure described in any of the other embodiments in this specification as appropriate.

Embodiment 4

In this embodiment, a semiconductor device which is different from that in Embodiment 3 is described. Here, as the semiconductor device, an example of a display device is described with reference to FIG. 8 and FIG. 9. Note that components which are the same as the solid-state image sensor in FIG. 3 are denoted by the same reference numerals, and detailed description of such components is omitted.

The structure of the display device is described with reference to FIG. 8. A display device 500 includes a pixel portion 501, the control circuit portion 331 (hereinafter also referred to as the first control circuit portion 331), a second control circuit portion 563, the controller 311, and the sensor portion 371.

The structure of the controller 1100 illustrated in FIG. 1 in Embodiment 1 or the structure of the controller 2100 described in Embodiment 2 is employed as the structure of the controller 311. The pixel portion 501 includes at least the first photo sensor 1000 described in Embodiment 1 or 2. The sensor portion 371 includes at least the second photo sensor 1200 described in Embodiment 1 or 2.

The pixel portion 501 includes a plurality of pixels 533 arranged in matrix in a row direction and a column direction. The pixel 533 includes the first photo sensor 335 (corresponding to the first photo sensor 1000 described in Embodiment 1 or 2) and a display element 537. The first photo sensor 335 can detect an object that is in contact with or close to the pixel portion 501 and can take an image.

Figure 3:
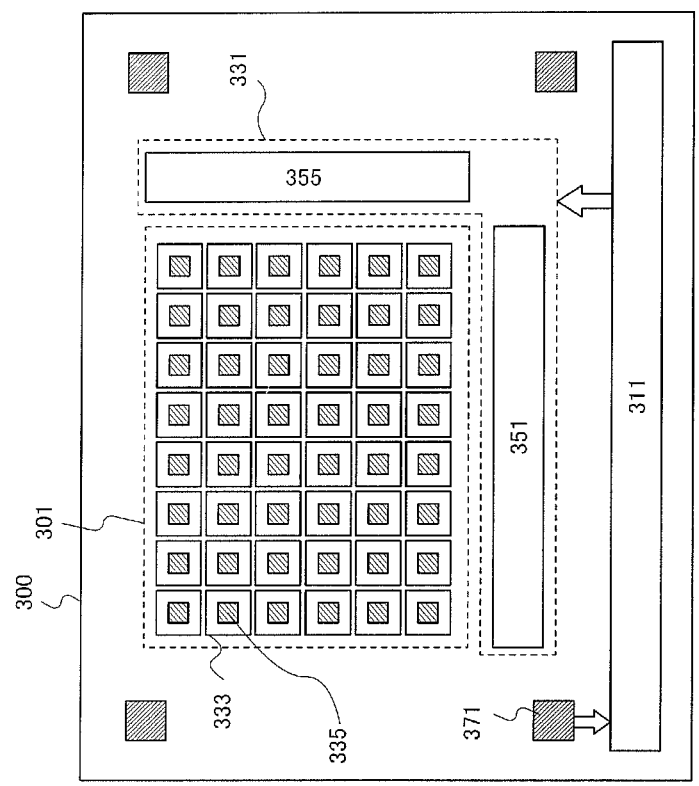
FIG. 3 illustrates a structure of a semiconductor device.
Figure 8:
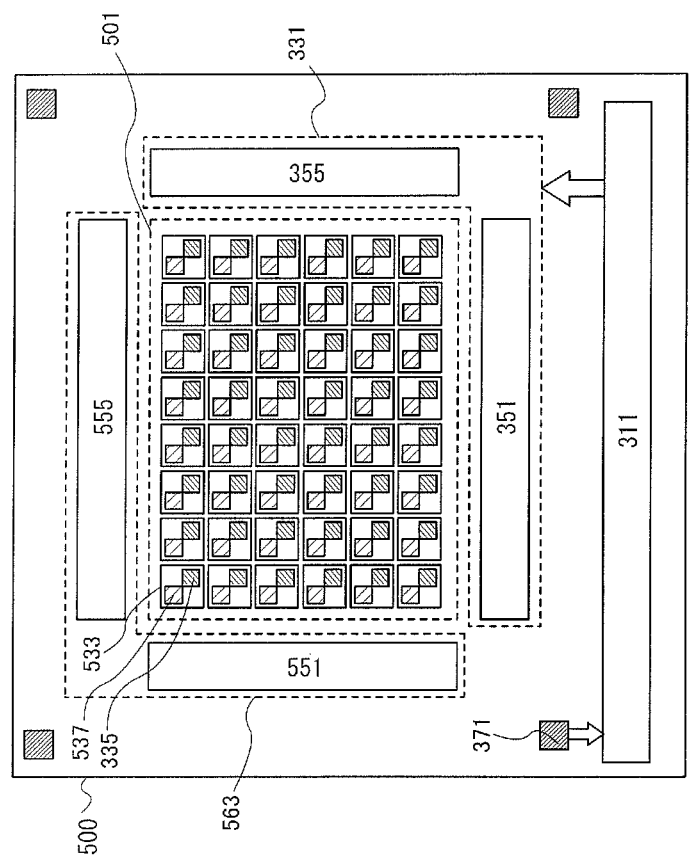
FIG. 8 illustrates a structure of a semiconductor device.

The big difference between the structure in FIG. 8 and the structure in FIG. 3 is that the presence or absence of the display element 537 and the second control circuit portion 563. The solid-state image sensor with the structure in FIG. 3 has an image pickup function. In contrast, the display device with the structure in FIG. 8 has a function of displaying an image in addition to the image pickup function. Thus, the display device in FIG. 8 can have an input function and a display function. An example of such a display device is a touch panel.

The display element 537 includes a transistor, a storage capacitor, a liquid crystal element, and the like. The liquid crystal element includes a liquid crystal layer.

The transistor included in the display element 537 has a function of controlling injection or release of electrical charges into/from the storage capacitor. The storage capacitor has a function of holding an electrical charge which corresponds to voltage applied to the liquid crystal layer. Utilizing the change in a polarization direction due to application of voltage to the liquid crystal layer, brightness and darkness (gray level) of light passing through the liquid crystal layer is made, so that images can be displayed. Light that emits from a rear side of a liquid crystal display device from a light source (e.g., a backlight) is used as the light passing through the liquid crystal layer.

Note that although the case where the display element 537 includes a liquid crystal element is described, the display element 537 may include a different element such as a light-emitting element instead of the liquid crystal element. The light-emitting element is an element whose luminance is controlled by current or voltage. Specifically, a light-emitting diode, an organic light-emitting diode (OLED), or the like can be used.

The first photo sensor 335 includes a transistor and an element which has a function of generating an electric signal when receiving light. As a specific example of the element which has a function of generating an electric signal when receiving light, there is a photodiode.

The first photo sensor 335 detects an object by determining whether the pixel portion 501 is shaded because outside light is blocked by the object or the outside light enters the pixel portion 501. That is, the first photo sensor 335 can detect an object with the use of outside light. Further, the first photo sensor 335 can detect an object with the use of light which is delivered from a light source such as a backlight and reflected off the object. Furthermore, the first photo sensor 335 can detect an object with the use of both of outside light and reflected light.

The second control circuit portion 563 is a circuit for controlling the display element 537. The second control circuit portion 563 includes a display element driver circuit 555 which inputs a signal to the display element 537 through a signal line (also referred to as a source signal line) such as a video data signal line; and a display element driver circuit 551 which inputs a signal to the display element 537 through a scan line (also referred to as a gate signal line). For example, the display element driver circuit 551 has a function of selecting display elements included in pixels provided in a particular row. In addition, the display element driver circuit 555 has a function of applying a given potential to the display elements included in the pixels provided in a selected row. Note that in a display element to which a high potential (a high-level potential) is applied from the display element driver circuit 551, a transistor is turned on, and an electrical charge is supplied from the display element driver circuit 555.

The description of the first control circuit portion 331 is based on the description in Embodiment 3; thus, such description is omitted.

Figure 9:
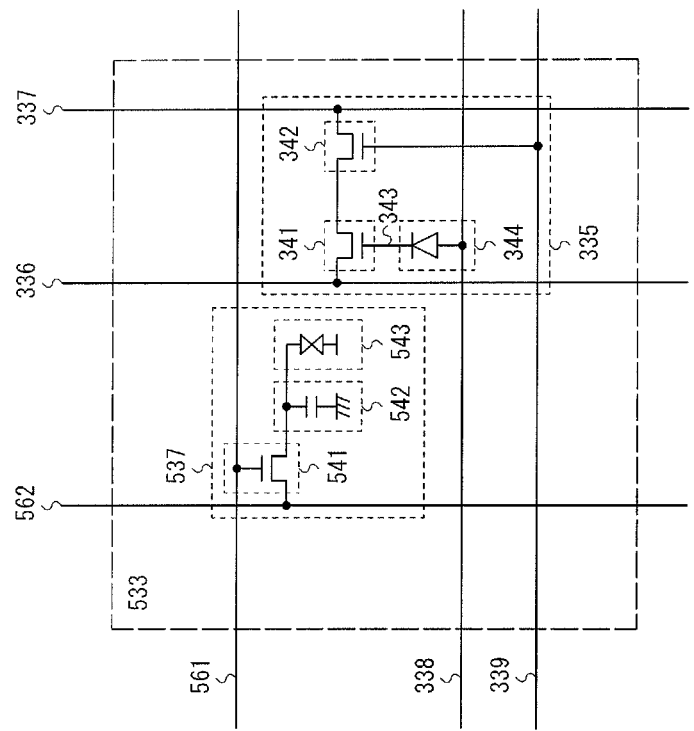
FIG. 9 illustrates a circuit structure of a pixel in the semiconductor device.

Next, the circuit diagram of the pixel 533 is described with reference to FIG. 9. The pixel 533 includes the display element 537 including a transistor 541, a storage capacitor 542, and a liquid crystal element 543 and the first photo sensor 335 including the photodiode 344, the transistor 341, and the transistor 342.

A gate of the transistor 541 is electrically connected to a gate signal line 561. One of a source and a drain of the transistor 541 is electrically connected to a seventh wiring 562. The other of the source and the drain of the transistor 541 is electrically connected to one electrode of the storage capacitor 542 and one electrode of the liquid crystal element 543. The potential of the other electrode of the storage capacitor 542 is kept constant. The potential of the other electrode of the liquid crystal element 543 is kept constant. The liquid crystal element 543 includes a pair of electrodes and a liquid crystal layer provided between the pair of electrodes.

When "H" is applied to the gate signal line 561, the potential of the seventh wiring 562 is applied to the storage capacitor 542 and the liquid crystal element 543 through the transistor 541. The storage capacitor 542 holds the applied potential. The liquid crystal element 543 changes transmittance in accordance with the applied potential.

One electrode of the photodiode 344 is electrically connected to the third wiring 338. The other electrode of the photodiode 344 is electrically connected to the gate of the transistor 341. One of the source and the drain of the transistor 341 is electrically connected to the first wiring 336. The other of the source and the drain of the transistor 341 is electrically connected to one of the source and the drain of the transistor 342. The gate of the transistor 342 is electrically connected to the fourth wiring 339. The other of the source and the drain of the transistor 342 is electrically connected to the second wiring 337.

The structure of the photo sensor read circuit 351 and the read operation in the first photo sensor 335 are based on the description in Embodiment 3. Specifically, the structure in FIG. 5 can be employed as the structure of the photo sensor read circuit 351. Further, the description made with reference to the timing chart in FIG. 6 can be employed as the description of the read operation in the first photo sensor 335.

In this embodiment, as in the solid-state image sensor 300 in FIG. 3, in the case where the intensity of light which enters the pixel portion 501 is too high or too low, the accuracy of image pickup might be decreased and image data might be blurred.

Thus, in order to obtain luminance levels of two peaks that are apart from each other as illustrated in the histogram indicated by the solid line 1301 in FIG. 7, the display device 500 in this embodiment obtains the intensity of outside light with the use of the sensor portion 371 provided around (outside) the pixel portion 501 and changes the sensitivity of the first photo sensor 335 by the controller 311 in accordance with the intensity of outside light. Optimization is performed when the intensity of outside light is obtained with the use of the sensor portion 371 and the sensitivity of the first photo sensor 335 is changed by the controller 311 in accordance with the intensity of outside light. An image is taken using the optimized first photo sensor 335. Thus, it is possible to realize the display device 500 which can suppress the influence of the intensity of outside light which depends on a usage environment or the like to a minimum and which can obtain image data with high accuracy.

Note that the structure described in this embodiment can be combined with the structure described in any of the other embodiments in this specification as appropriate.

Embodiment 5

In this embodiment, examples of circuit diagrams applicable to photo sensors are described with reference to FIGS. 12A and 12B, FIGS. 13A and 13B, and FIGS. 14A to 14C. The photo sensors described in this embodiment can be used instead of the first photo sensor 335 illustrated in FIG. 4 and FIG. 9.

Figure 12A:
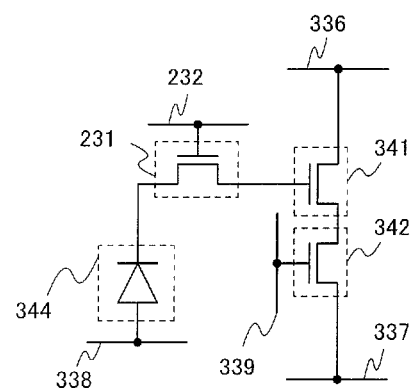
FIGS. 12A and 12B illustrate circuit structures of the pixel in the semiconductor device.

FIG. 12A illustrates the photo sensor illustrated in FIG. 4 that further includes a transistor 231 and an eighth wiring 232. A gate of the transistor 231 is electrically connected to the eighth wiring 232. One of a source and a drain of the transistor 231 is electrically connected to the other electrode of the photodiode 344. The other of the source and the drain of the transistor 231 is electrically connected to the gate of the transistor 341. The transistor 231 has a function of holding electrical charges accumulated in the gate of the transistor 341.

Figure 12B:
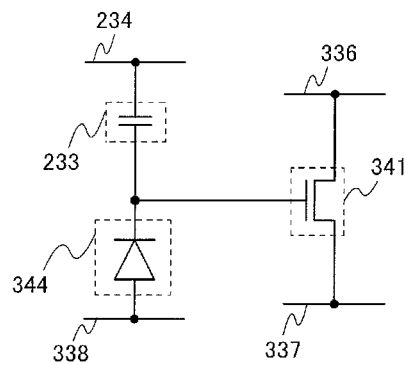

FIG. 12B illustrates the photo sensor illustrated in FIG. 4 that further includes a storage capacitor 233 and a ninth wiring 234 and does not include the transistor 342 and the fourth wiring 339. One electrode of the storage capacitor 233 is electrically connected to the other electrode of the photodiode 344. The other electrode of the storage capacitor 233 is electrically connected to the ninth wiring 234. One of the source and the drain of the transistor 341 is electrically connected to the second wiring 337.

Figure 13A:
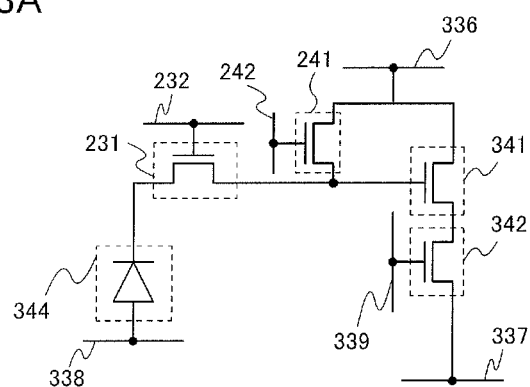
FIGS. 13A and 13B illustrate circuit structures of the pixel in the semiconductor device.

FIG. 13A illustrates the photo sensor illustrated in FIG. 12A that further includes a transistor 241 and a tenth wiring 242. A gate of the transistor 241 is electrically connected to the tenth wiring 242. One of a source and a drain of the transistor 241 is electrically connected to the other of the source and the drain of the transistor 231 and the gate of the transistor 341. The other of the source and the drain of the transistor 241 is electrically connected to the first wiring 336 and one of the source and the drain of the transistor 341. The transistor 241 has a function of supplying a reset signal to the gate of the transistor 341.

Figure 13B:
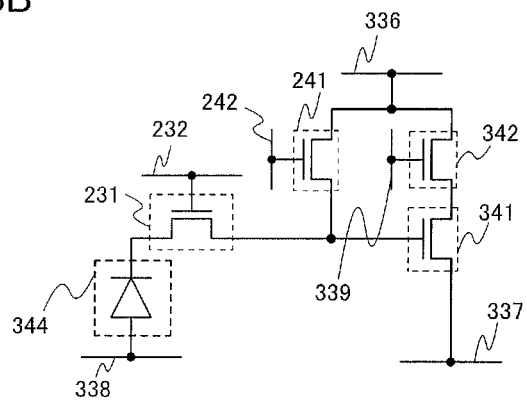

FIG. 13B illustrates the photo sensor illustrated in FIG. 13A where the connection relation between the transistor 341 and the transistor 342 is changed. The gate of the transistor 341 is electrically connected to the other of the source and the drain of the transistor 231 and one of the source and the drain of the transistor 241. One of the source and the drain of the transistor 341 is electrically connected to one of the source and the drain of the transistor 342. The other of the source and the drain of the transistor 341 is electrically connected to the second wiring 337. The other of the source and the drain of the transistor 342 is electrically connected to the first wiring 336 and the other of the source and the drain of the transistor 241.

Figure 14A:
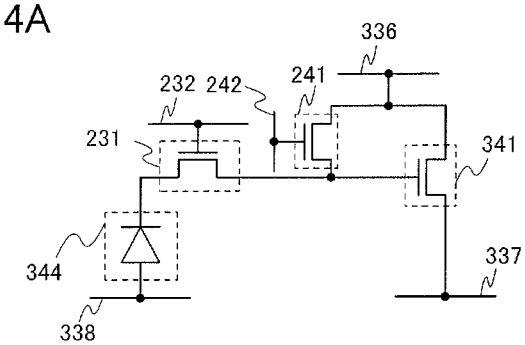
FIGS. 14A to 14C illustrate circuit structures of the pixel in the semiconductor device.

FIG. 14A illustrates the photo sensor illustrated in FIG. 13A that does not include the transistor 342 and the fourth wiring 339. The other of the source and the drain of the transistor 341 is electrically connected to the second wiring 337.

Figure 14B:
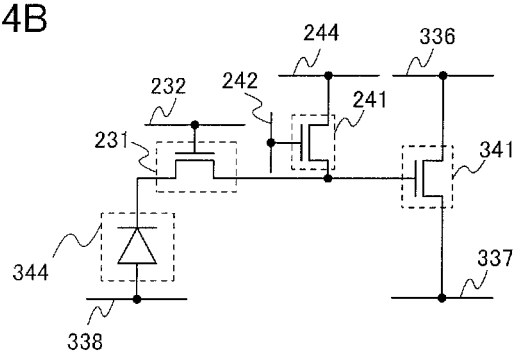

FIG. 14B illustrates the photo sensor illustrated in FIG. 14A where the connection relation between the transistor 241 and the transistor 341 is changed. The other of the source and the drain of the transistor 241 is electrically connected to an eleventh wiring 244. One of the source and the drain of the transistor 341 is electrically connected to the first wiring 336. The other of the source and the drain of the transistor 341 is electrically connected to the second wiring 337.

Figure 14C:
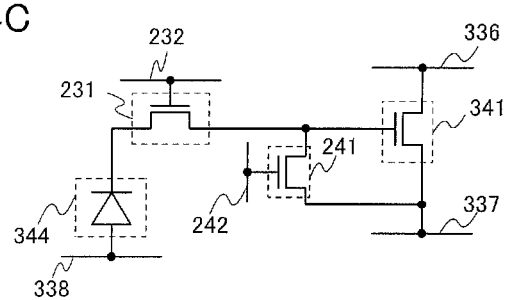

FIG. 14C illustrates the photo sensor illustrated in FIG. 14A where the connection relation between the transistor 241 and the transistor 341 is changed. The other of the source and the drain of the transistor 241 is electrically connected to the other of the source and the drain of the transistor 231 and the gate of the transistor 341. One of the source and the drain of the transistor 241 is electrically connected to the other of the source and the drain of the transistor 341 and the second wiring 337.

As described above, the photo sensor can have a variety of circuit structures depending on desired performance. When the drive condition of the photo sensor is changed by the controller described in Embodiment 1 or 2 in accordance with the intensity of outside light, an image can be taken after the sensitivity of the photo sensor is optimized. Thus, highly accurate image data can be obtained.

Note that the structure described in this embodiment can be combined with the structure described in any of the other embodiments in this specification as appropriate.

Embodiment 6

In this embodiment, an example of the display device described in the above embodiment is described with reference to FIG. 10.

Figure 10:
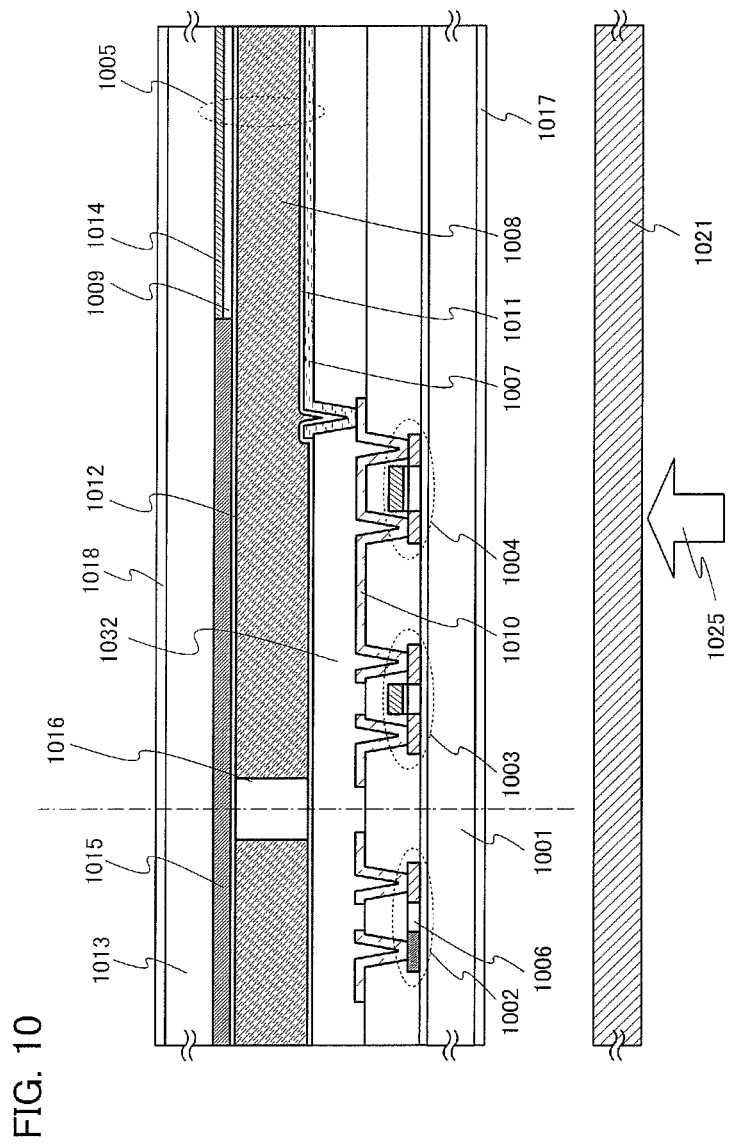
FIG. 10 is a schematic view of a cross section of a semiconductor device.

FIG. 10 is the cross-sectional view of the display device in this embodiment. In the display device illustrated in FIG. 10, a photodiode 1002, a transistor 1003, a storage capacitor 1004, and a liquid crystal element 1005 are provided over a substrate 1001 having all insulating surface.

In FIG. 10, part of the photo sensor in the pixel portion is illustrated on the left side of a clashed-and-clotted line which extends longitudinally and part of the display element is illustrated on the right side of the dashed-and-dotted line. These structures are similar to the structure of the pixel 533 (the structures of the first photo sensor 335 and the display element 537) described in Embodiment 4 (see FIG. 9).

In FIG. 10, the photodiode 1002 and a transistor (not illustrated) are included in the photo sensor in the pixel portion. Further, the transistor 1003, the storage capacitor 1004, and the liquid crystal element 1005 are included in the display element.

The photodiode 1002 and the storage capacitor 1004 can be formed together with the transistor 1003 in a process for forming the transistor 1003.

The photodiode 1002 is a lateral pin diode. A semiconductor film 1006 included in the photodiode 1002 has a region containing an impurity element which imparts p-type conductivity (such a region is also referred to as a p-type semiconductor layer), a region having the characteristics of an intrinsic semiconductor (such a region is also referred to as an i-type semiconductor layer), and a region containing an impurity element which imparts n-type conductivity (such a region is also referred to as an n-type semiconductor layer).

Note that although the case where the photodiode 1002 is the lateral pin diode (pin junction) is described in this embodiment, the photodiode 1002 may be a pn diode (pn junction). It is possible to form a pin diode or a pn diode when an impurity which imparts p-type conductivity and an impurity element which imparts n-type conductivity are added to specified regions of the semiconductor film 1006.

A vertical diode can be used as the photodiode 1002 instead of the lateral diode. In that case, a pin diode can be obtained when a p-type semiconductor layer, an i-type semiconductor layer, and an n-type semiconductor layer are stacked, or a pn diode can be obtained when a p-type semiconductor layer and an n-type semiconductor layer are sequentially stacked.

The structure, material, and the like of the transistor 1003 are selected as appropriate depending on desired performance. For example, a transistor which includes a semiconductor film containing amorphous silicon, microcrystalline silicon, polycrystalline silicon, or the like can be used. Alternatively, a transistor which includes an oxide semiconductor can be used. Further, a top-gate transistor in which a gate electrode is provided over a semiconductor film or a bottom-gate transistor in which a gate electrode is provided below a semiconductor film may be used. Furthermore, a top-contact transistor in which a source electrode and a drain electrode are provided over a semiconductor film or a bottom-contact transistor in which a source electrode and a drain electrode are provided below a semiconductor film may be used.

FIG. 10 illustrates the top-gate transistor 1003 as an example. In the structure of FIG. 10, a semiconductor film is formed over the substrate 1001 and is processed (patterned) into a desired shape by etching or the like so that an island-shaped semiconductor film for the photodiode 1002 and an island-shaped semiconductor film for the transistor 1003 can be formed in the same process. Thus, manufacturing cost can be reduced because it is not necessary to add a separate process for forming a photodiode to a normal process for manufacturing a panel.

The liquid crystal element 1005 includes a pixel electrode 1007, liquid crystals 1008, and a counter electrode 1009. The pixel electrode 1007 is formed over an insulating film 1032 functioning as a planarization film.

The pixel electrode 1007 is electrically connected to the transistor 1003 and the storage capacitor 1004 through the conductive film 1010. Further, the counter electrode 1009 is formed on a substrate (a counter substrate) 1013, and the liquid crystals 1008 are interposed between the pixel electrode 1007 and the counter electrode 1009.

Note that FIG. 10 does not illustrate the transistor included in the photo sensor provided in the pixel portion. The transistor included in the photo sensor provided in the pixel portion can be formed over the substrate 1001 together with the transistor 1003 in the process for forming the transistor 1003.

The cell gap between the pixel electrode 1007 and the counter electrode 1009 can be controlled using a spacer 1016. FIG. 10 illustrates an example in which the cell gap is controlled using the columnar spacer 1016 selectively formed through photolithography. Note that the position of the spacer 1016 in FIG. 10 is just an example. The position, number, density, and the like of the spacer can be determined by a practitioner in a given way. Alternatively, instead of the columnar spacer 1016, the cell gap can be controlled when spherical spacers are dispersed between the pixel electrode 1007 and the counter electrode 1009.

In addition, the liquid crystals 1008 are surrounded by a sealant between the substrate 1001 and the substrate 1013. The liquid crystals 1008 may be injected by a dispenser method (a droplet method) or a dipping method (a pumping method).

For the pixel electrode 1007, it is possible to use a light-transmitting conductive material such as indium tin oxide, indium tin oxide containing silicon oxide, organic indium, organic tin, indium zinc oxide (IZO) containing zinc oxide, zinc oxide, zinc oxide containing gallium, tin oxide, indium oxide containing tungsten oxide, indium zinc oxide containing tungsten oxide, indium oxide containing titanium oxide, or indium tin oxide containing titanium oxide.

In addition, in the case where the liquid crystal element 1005 is transmissive, the counter electrode 1009 can be formed using the light-transmitting conductive material as in the case of the pixel electrode 1007.

An alignment film 1011 is provided between the pixel electrode 1007 and the liquid crystals 1008, and an alignment film 1012 is provided between the counter electrode 1009 and the liquid crystals 1008. The alignment film 1011 and the alignment film 1012 can be formed using an organic resin such as polyimide or polyvinyl alcohol. Alignment treatment for aligning liquid crystal molecules in a certain direction such as rubbing is performed on a surface of the alignment film 1011 and a surface of the alignment film 1012. Rubbing can be performed by rolling a roller wrapped with cloth of nylon or the like while applying pressure on the alignment films so that the surfaces of the alignment films are rubbed in a certain direction. Note that by using an inorganic material such as silicon oxide, the alignment film 1011 and the alignment film 1012 each having an alignment property can be directly formed by evaporation without alignment treatment.

Further, a color filter 1014 capable of transmitting light in a particular wavelength range is formed over the substrate 1013 so as to overlap with the liquid crystal element 1005. After an organic resin such as an acrylic-based resin in which a pigment is dispersed is applied on the substrate 1013, the organic resin is processed into a desired shape so that the color filter 1014 can be selectively formed. Alternatively, after a polyimide-based resin in which a pigment is dispersed is applied on the substrate 1013, the polyimide-based resin is processed into a desired shape so that the color filter 1014 can be selectively formed. Alternatively, the color filter 1014 can be selectively formed by a droplet discharge method such as an ink jet method without the use of photography.

Further, a light-blocking film 515 capable of blocking light is formed over the substrate 1013 so as to overlap with the photodiode 1002. The light-blocking film 1015 can prevent light from the backlight that passes through the substrate 1013 and enters the pixel portion from directly being delivered to the photodiode 1002. Furthermore, the light-blocking film 1015 can prevent disinclination due to disorder of alignment of the liquid crystals 1008 among pixels from being observed. An organic resin containing a black pigment such as carbon black or titanium lower oxide can be used for the light-blocking film 1015. Alternatively, a film containing chromium can be used for the light-blocking film 1015.

Further, a polarizing plate 1017 is provided on the side of the substrate 1001, which is opposite to the side over which the pixel electrode 1007 is provided. Furthermore, a polarizing plate 1018 is provided on the side of the counter substrate 1013, which is opposite to the side over which the counter electrode 1009 is provided.

The liquid crystal element 1005 can include TN (twisted nematic) liquid crystals, VA (vertical alignment) liquid crystals, OCB (optically compensated birefringence) liquid crystals, IPS (in-plane switching) liquid crystals, or the like. Note that although the liquid crystal element 1005 in which the liquid crystals 1008 are provided between the pixel electrode 1007 and the counter electrode 1009 is described as an example in this embodiment, a display device in one embodiment of the present invention is not limited to this structure. A liquid crystal element in which a pair of electrodes is formed on the substrate 1001 side, like an IPS liquid crystal element, may be used.

In addition, although an example in which a thin semiconductor film is formed over the substrate having an insulating surface and is used for the photodiode 1002, the transistor 1003, and the storage capacitor 1004 is described in this embodiment, a single crystal semiconductor substrate, an SOI substrate, or the like may be used for the photodiode 1002, the transistor 1003, and the storage capacitor 1004.

In this embodiment, light is delivered from the substrate 1001 side as indicated by an arrow 1025, and an object 1021 to be detected is positioned on the substrate 1001 side. In that case, the object 1021 to be detected blocks light delivered in the direction indicated by the arrow 1025, so that the incidence of the light into the photodiode 1002 is blocked. Thus, the photodiode 1002 detects the shadow of the object.

Light from the backlight is delivered from the substrate 1013 side. Further, light is delivered to the object 1021 to be detected on the substrate 1001 side through the liquid crystal element 1005, and light reflected off the object 1021 to be detected enters the photodiode 1002. The photodiode 1002 detects the shadow of the object 1021.

In addition, in the structure of FIG. 10, it is assumed that light is delivered from the substrate 1013 side and the object to be detected is positioned on the substrate 1013 side. In that case, for example, all opening is provided in the light-blocking film 1015 so that light enters the photodiocle 1002 from the substrate 1013 side. Further, a light-blocking film is provided so as to overlap with the photodiode 1002 on the substrate 1001 side, for example. Accordingly, light does not enter the photodiode 1002 from the substrate 1001 side. When the object to be detected is provided, the object to be detected blocks light which is delivered from the substrate 1013 side, so that the incidence of the light into the photodiode 1002 is blocked. Thus, the photodiode 1002 detects the shadow of the object.

Further, in the structure of FIG. 10, in the case where light is delivered from the substrate 1013 side and the object to be detected is positioned on the substrate 1013 side, light from the backlight is delivered from the substrate 1001 side. Light is delivered to the object to be detected on the substrate 1013 side through the liquid crystal element 1005, and light reflected off the object to be detected enters the photodiode 1002. The photodiode 1002 detects the reflected light of the object.

Figure 11:
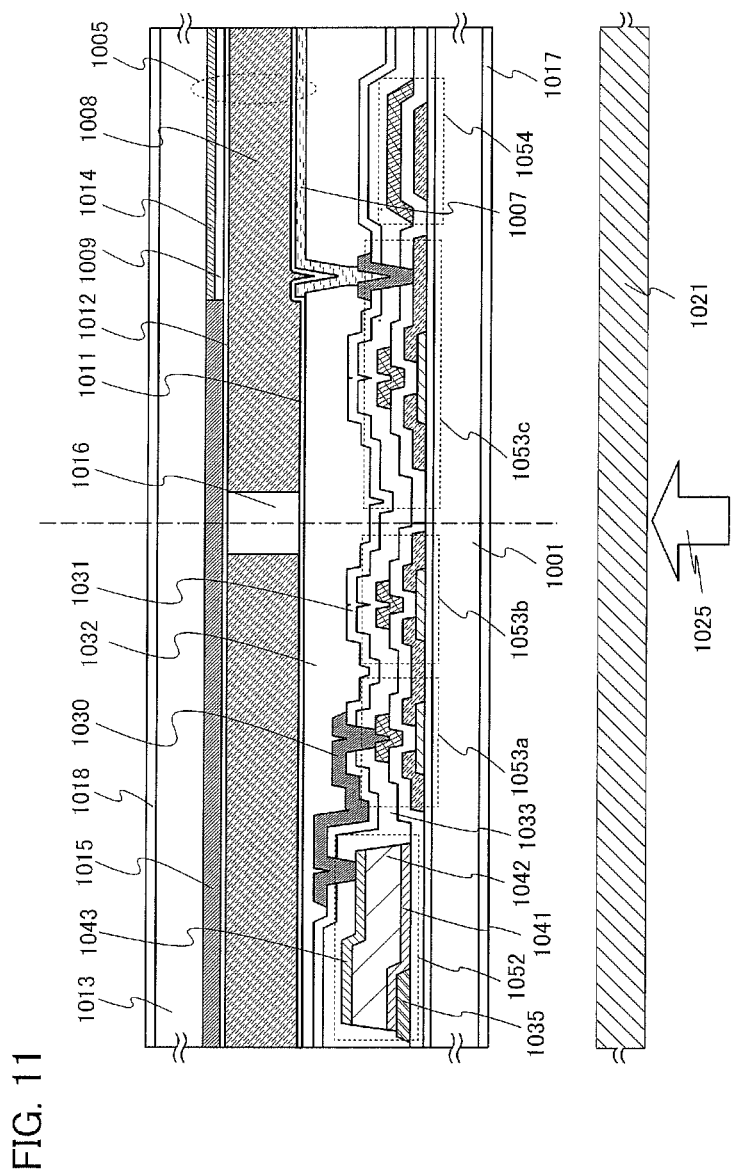
FIG. 11 is a schematic view of a cross section of a semiconductor device.

FIG. 11 illustrates an example of the cross-sectional view of a display device which is different from that in FIG. 10. In the display device illustrated in FIG. 11, a photodiode 1052, a transistor 1053a, a transistor 1053b, a transistor 1053c, a storage capacitor 1054, and the liquid crystal element 1005 are provided over the substrate 1001 having an insulating surface.

In FIG. 11, part of a photo sensor in the pixel portion is illustrated on the left side of a dashed-and-dotted line positioned in the center and part of the display element is illustrated on the right side of the dashed-and-dotted line. These structures are similar to the structure of the pixel 533 (the structures of the first photo sensor 335 and the display element 537) described in Embodiment 4 (see FIG. 9).

In FIG. 11, the photodiode 1052, the transistor 1053a, and the transistor 1053b are included in the photo sensor in the pixel portion. Further, the transistor 1053c, the storage capacitor 1054, and the liquid crystal element 1005 are included in the display element.

FIG. 11 illustrates an example in which the transistor 1053a, the transistor 1053b, and the transistor 1053c are top-gate transistors. Note that as in the above embodiment, the structures, materials, and the like of the transistors can be selected as appropriate, and the structures of the transistors are not limited to the structures described in the drawing.

Here, a transistor including an oxide semiconductor is preferably used as the transistor included in the photo sensor in the pixel portion. The transistor including an oxide semiconductor has significantly low off-state current; thus, an electrical charge hold function can be improved.

A wiring 1030 is connected to a gate electrode of the transistor 1053a and is electrically connected to a cathode of the photodiode 1052. The wiring 1030 corresponds to the gate signal line 343 illustrated in FIG. 9. Note that the wiring 1030 may be formed over an insulating film 1033 instead of an insulating film 1031.

One of a source electrode and a drain electrode of the transistor 1053a is electrically connected to one of a source electrode and a drain electrode of the transistor 1053b. The other of the source electrode and the drain electrode of the transistor 1053a is electrically connected to a wiring (corresponding to the first wiring 336 in FIG. 9). In addition, the other of the source electrode and the drain electrode of the transistor 1053b is electrically connected to a wiring (corresponding to the second wiring 337 in FIG. 9).

FIG. 11 illustrates an example in which the photodiode 1052 is a vertical pin diode. Specifically, in the photodiode 1052, a p-type semiconductor layer 1041, an i-type semiconductor layer 1042, and an n-type semiconductor layer 1043 are sequentially stacked. In the photodiode 1052, pin junction is formed using a layered structure.

As a typical example of the photodiode 1052, there is a photodiode in which amorphous silicon is used for the i-type semiconductor layer 1042. In that case, although amorphous silicon can be used also for the p-type semiconductor layer 1041 and the n-type semiconductor layer 1043, it is preferable to use microcrystalline silicon with high electric conductivity. The photodiode in which amorphous silicon is used for the i-type semiconductor layer 1042 has photosensitivity in a visible light region and can prevent malfunctions due to infrared rays.

Note that although the case where the photodiode 1052 is the pin diode is described in this embodiment, the photodiode 1052 may be a pn diode. In the case where the photodiode 1052 is a pn diode, it is preferable to use high-quality crystalline silicon for a p-type semiconductor layer and an n-type semiconductor layer. Further, although the case where the photodiode 1052 is the vertical diode is described in this embodiment, a lateral diode may be used as in FIG. 10.

The p-type semiconductor layer 1041 serving as an anode of the photodiode 1052 is electrically connected to a signal wiring 1035. The n-type semiconductor layer 1043 serving as the cathode of the photodiode 1052 is electrically connected to the gate electrode of the transistor 1053a. Note that the signal wiring 1035 corresponds to the third wiring 338 illustrated in FIG. 9.

Note that a light-transmitting conductive layer may be provided on a side where light enters in the p-type semiconductor layer 1041 of the photodiode 1052. Further, a conductive layer may be provided on an interface side with the insulating film 1033 of the n-type semiconductor layer 1043. For example, the wiring 1030 may extend so as to cover the n-type semiconductor layer 1043. When a conductive layer is provided on the side where light enters in the p-type semiconductor layer 1041 or the interface side with the insulating film 1033 of the n-type semiconductor layer 1043, loss of electrical charges due to the resistance of the p-type semiconductor layer 1041 or the resistance of the n-type semiconductor layer 1043 can be reduced.

The transistor 1053c is provided in order to drive the liquid crystal element. One of a source electrode and a drain electrode of the transistor 1053c is electrically connected to the pixel electrode 1007. The other of the source electrode and the drain electrode of the transistor 1053c is connected to a signal wiring (not illustrated).

The storage capacitor 1054 can be formed together with the transistor 1053a, the transistor 1053b, and the transistor 1053c. A capacitor wiring and a capacitor electrode of the storage capacitor 1054 are formed in a step of forming gate electrodes of the transistors 1053a, 1053b, and 1053c or a step of forming source electrodes and drain electrodes of the transistors 1053a, 1053b, and 1053c. An insulating film serving as a dielectric film is formed in a step of forming a gate insulating film. The storage capacitor 1054 is connected to one of the source electrode and the drain electrode of the transistor 1053c in parallel to the liquid crystal element 1005.

The pixel electrode 1007 which is electrically connected to the transistor 1053c and the storage capacitor 1054 is formed over the insulating film 1032 functioning as a planarization film. Note that the structures of the components from the pixel electrode 1007 to the upper substrate (the counter substrate) 1013 are similar to the structures in FIG. 10; thus, description of the structures is omitted.

As such a display device, a display device which includes the photo sensor in the pixel portion described in the above embodiment can be used. Note that FIG. 10 and FIG. 11 correspond to cross sections of the semiconductor device described in Embodiment 4 and further include sensor portions (photo sensors) and controllers around the pixel portions. The display devices illustrated in FIG. 10 and FIG. 11 obtain the intensity of outside light by the photo sensors provided around the pixel portions. The controllers change the drive conditions of the photo sensors provided in the pixel portions in accordance with the intensity of outside light. Images are taken after the sensitivities of the photo sensors provided in the pixel portions are changed in accordance with the drive conditions set by the controllers. In the display devices, optimization is performed when the drive conditions of the photo sensors provided in the pixel portions are changed in accordance with the intensity of outside light, and images are taken using the optimized photo sensors. Therefore, highly accurate image data can be obtained.

Note that the structures of the pixel portions illustrated in FIG. 10 and FIG. 11 can be used as the structures of the sensor portions provided around the pixel portions.

The display devices illustrated in FIG. 10 and FIG. 11 have display functions in addition to image pickup functions. Thus, the display devices illustrated in FIG. 10 and FIG. 11 can have input functions and display functions, so that highly functional display devices can be provided. In particular, since highly accurate image data can be obtained, images can be input with higher accuracy.

Note that the structure described in this embodiment can be combined with the structure described in any of the other embodiments in this specification as appropriate.

Embodiment 7

In this embodiment, an application example of a semiconductor device including the photo sensor provided in the pixel and the photo sensor provided around the pixel which are described in the above embodiment is described.

Figure 15:
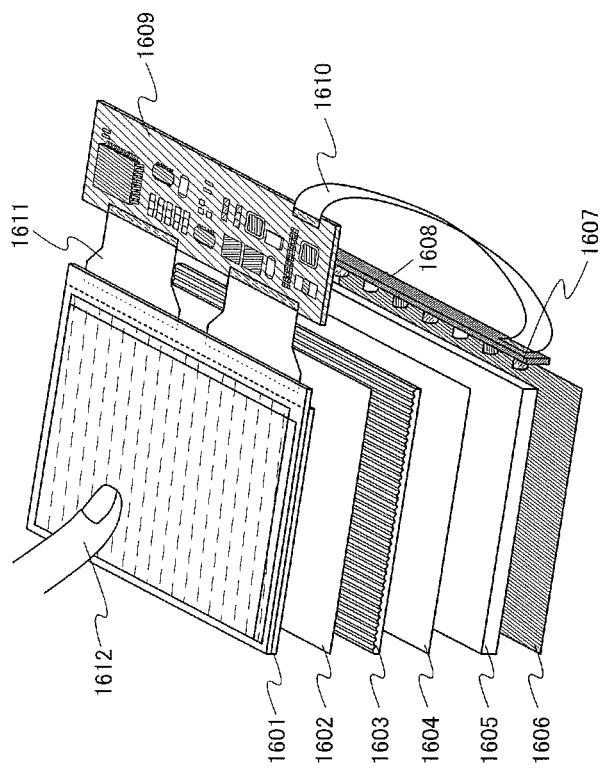
FIG. 15 illustrates an example of an electronic device including the semiconductor device.

First, an example of a touch panel including a display device in which a photo sensor is provided in a pixel portion is described. FIG. 15 illustrates an example of a perspective view illustrating the structure of the display device. The display device illustrated in FIG. 15 includes a panel 1601, a first diffusion plate 1602, a prism sheet 1603, a second diffusion plate 1604, a light guide plate 1605, a reflector 1606, a backlight 1608, and a circuit board 1609. The panel 1601 has a structure in which a pixel portion including a liquid crystal element, a photodiode, a thin film transistor, and the like is formed between a pair of substrates. The backlight 1608 includes a plurality of light sources 1607.

The panel 1601, the first diffusion plate 1602, the prism sheet 1603, the second diffusion plate 1604, the light guide plate 1605, and the reflector 1606 are sequentially stacked. The light sources 1607 are provided at an end portion of the light guide plate 1605. Light from the light sources 1607 that is diffused in the light guide plate 1605 is uniformly delivered to the panel 1601 from the counter substrate side by the first diffusion plate 1602, the prism sheet 1603, and the second diffusion plate 1604.

Although the two diffusion plates (the first diffusion plate 1602 and the second diffusion plate 1604) are used in this embodiment, the number of diffusion plates is not limited to two. The number of diffusion plates may be one, or may be three or more. It is acceptable as long as the diffusion plate is provided between the light guide plate 1605 and the panel 1601. Thus, in the structure of FIG. 15, the diffusion plate may be provided only on a side closer to the panel 1601 than the prism sheet 1603, or may be provided only on a side closer to the light guide plate 1605 than the prism sheet 1603.

Further, the shape of the cross section of the prism sheet 1603 is not limited to a sawtooth shape illustrated in FIG. 15, but may be a shape with which light from the light guide plate 1605 can be concentrated on the panel 1601 side.

The circuit board 1609 includes a circuit for generating or processing various kinds of signals to be input to the panel 1601, a circuit for processing various kinds of signals to be output from the panel 1601, and the like. In FIG. 15, the circuit board 1609 and the panel 1601 are connected to each other via a flexible printed circuit (FPC) 1611. Note that the circuits provided over the circuit board 1609 may be connected to the panel 1601 by a chip on glass (COG) method, or some of the circuits may be connected to the FPC 1611 by a chip on film (COF) method.

FIG. 15 illustrates an example in which the circuit board 1609 includes a control circuit which controls the drive of the light source 1607 and the control circuit and the light source 1607 are connected to each other via the FPC 1610. Note that the control circuit may be provided over the panel 1601. In that case, the panel 1601 and the light source 1607 are connected to each other via an FPC or the like.

Note that although FIG. 15 illustrates an edge-lit light source where the light source 1607 is provided at an end of the panel 1601, this embodiment is not limited to this. A direct-lit light source where the light source 1607 is provided directly below the panel 1601 may be used.

For example, when a finger 1612 which is an object to be detected gets close to the panel 1601 from an upper side. Part of light that passes through the panel 1601 from the backlight 1608 reflects off the finger 1612 and enters the panel 1601 again. Color image data of the finger 1612 which is the object to be detected can be obtained when the light sources 1607 that correspond to individual colors are sequentially lit and images are taken in each color. Further, the position of the finger 1612 can be recognized from the image data, and the positional data and data of a display image are combined so that the panel 1601 can function as a touch panel.

When the display device described in the above embodiment is used, highly accurate images can be taken regardless of a usage environment such as a dark place or a well-lighted place. Images are taken after the sensitivity of the photo sensor in the pixel portion is changed according to the circumstances even in places with various luminance levels; thus, convenience can be improved.

Figure 16:
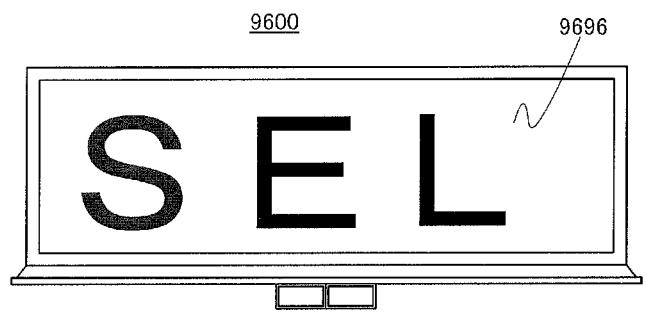
FIG. 16 illustrates an example of an electronic device including the semiconductor device.

Next, FIG. 16 illustrates an example of a writing board (also referred to as a blackboard or a whiteboard) including the semiconductor device (the solid-state image sensor, the display device, or the like) described in the above embodiment. For example, a panel portion 9696 of a writing board 9600 can include the semiconductor device described in the above embodiment.

Here, it is possible to write characters and the like freely with a marker or the like on a surface of the panel portion 9696. A glass substrate or a transparent synthetic resin sheet may be attached to the surface of the panel portion 9696.

The semiconductor device included in the panel portion 9696 includes a photo sensor in a pixel portion, so that images can be taken. Thus, when the writing board 9600 is connected to a printer or the like, characters, drawings, and the like written to the panel portion 9696 can be read and printed. Needless to say, the writing board 9600 itself may include a printer.

When the panel portion 9696 includes a display device including a photo sensor and a display element in a pixel portion, it is possible to write characters and the like with a marker or the like onto the surface of the panel portion 9696 while an image is displayed. When characters and drawings are written to the panel portion 9696 with an image displayed, the path of the marker read through image pickup and the image are synthesized to be displayed. The display image, the written character, and the like on the panel portion 9696 can be printed by a printer or the like.

With the semiconductor device described in the above embodiment, images can be taken even in a dark place after the sensitivity of the photo sensor provided in the pixel portion is optimized. Thus, highly accurate images can be taken and desired printed materials can be obtained. Note that images can be taken even in a too bright room or outside after the sensitivity of the photo sensor provided in the pixel portion is optimized. Thus, highly accurate images can be taken and desired printed materials can be obtained.

Next, examples of electronic devices each including the semiconductor device described in the above embodiment are described For example, the semiconductor device can be included in display devices such as displays, laptop personal computers, and image reproducing devices provided with recording media (typically devices which reproduce the content of recording media such as DVDs (digital versatile disc) and have displays for displaying the reproduced images). Further, the semiconductor device can be included in cellular phones, portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of these electronic devices. FIGS. 17A to 17D illustrate specific examples of these electronic devices.

Figure 17A:
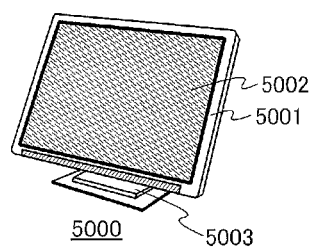
FIGS. 17A to 17D illustrate examples of electronic devices each including the semiconductor device.

FIG. 17A illustrates a display 700, which includes a housing 5001, a display portion 5002, a support 5003, and the like. The display panel described in the above embodiment can be included in the display portion 5002. Thus, images can be taken with the optimized sensitivity of the photo sensor regardless of the intensity of outside light which depends on a usage environment, so that highly accurate images can be taken. Accordingly, it is possible to provide the display 5000 with a highly functional application (a highly accurate image pickup function). Note that the display device includes, in its category, all the information display devices for personal computers, TV broadcast reception, advertisement, and the like.

Figure 17B:
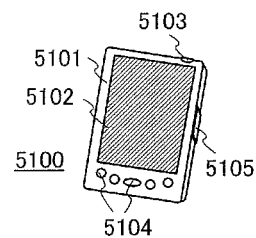

FIG. 17B illustrates a personal digital assistant 5100, which includes a housing 5101, a display portion 5102, a switch 5103, operation keys 5104, an infrared port 5105, and the like. The display panel described in the above embodiment can be included in the display portion 5102. Thus, images can be taken with the optimized sensitivity of the photo sensor regardless of the intensity of outside light which depends on a usage environment, so that highly accurate images can be taken. Accordingly, it is possible to provide the personal digital assistant 5100 with a highly functional application (a highly accurate image pickup function). In particular, since the personal digital assistant 5100 is expected to be carried in various kinds of places, it is effective to take highly accurate images regardless of the intensity of outside light which depends on a usage environment.

Figure 17C:
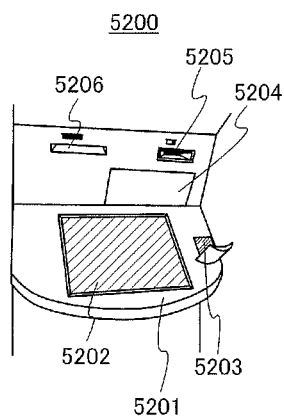

FIG. 17C illustrates an automated teller machine 5200, which includes a housing 5201, a display portion 5202, a coin slot 5203, a bill slot 5204, a card slot 5205, a bankbook slot 5206, and the like. The display panel described in the above embodiment can be included in the display portion 5202. Thus, images can be taken with the optimized sensitivity of the photo sensor regardless of the intensity of outside light which depends on a usage environment, so that highly accurate images can be taken. Accordingly, it is possible to provide the personal digital assistant 5100 with a highly functional application (a highly accurate image pickup function). The automated teller machine 5200 includes the display panel described in the above embodiment can read biological information to be used for biometric authentication, such as a fingerprint, a face, a hand print, a palm print, a hand vein pattern, or an iris, and the like which are used for biometrics with higher accuracy. Therefore, a false non-match rate which is caused by false recognition of a person to be identified as a different person and a false acceptance rate which is caused by false recognition of a different person as a person to be identified can be suppressed.

Figure 17D:
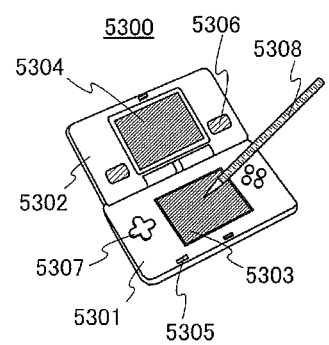

FIG. 17D illustrates a portable game machine 5300, which includes a housing 5301, a housing 5302, a display portion 5303, a display portion 5304, a microphone 5305, a speaker 5306, an operation key 5307, a stylus 5308, and the like. The display panel described in the above embodiment can be included in the display portion 5304. Thus, images can be taken with the optimized sensitivity of the photo sensor regardless of the intensity of outside light which depends on a usage environment, so that highly accurate images can be taken. Accordingly, it is possible to provide the portable game machine 5300 with a highly functional application (a highly accurate image pickup function). As in the personal digital assistant 5100, since the portable game machine 5300 is expected to be carried in various kinds of places, it is effective to take highly accurate images regardless of the intensity of outside light which depends on a usage environment. Note that although the portable game machine illustrated in FIG. 17D includes the two display portions 5303 and 5304, the number of display portions included in the portable game machine is not limited to two.

This embodiment can be combined with any of the other embodiments as appropriate.

This application is based on Japanese Patent Application serial No. 2010-054006 filed with Japan Patent Office on Mar. 11, 2010, the entire contents of which are hereby incorporated by reference.

The invention claimed is:

1. A semiconductor device comprising:
    a first photo sensor in a pixel;
    a transistor in the pixel, wherein the transistor is electrically connected to a pixel electrode;
    a second photo sensor out of the pixel;
    a controller for setting a drive condition of the first photo sensor in accordance with intensity of light obtained by the second photo sensor; and
    a light-blocking film overlapping with the first photo sensor and the transistor,
    wherein sensitivity of the first photo sensor is changed in accordance with the drive condition,
    wherein the first photo sensor includes a semiconductor layer, the semiconductor layer including a first region including an impurity element which imparts n-type conductivity and a second region including an impurity element which imparts p-type conductivity, and
    wherein the first region and the second region are over and in contact with a same surface.

2. The semiconductor device according to claim 1, wherein the drive condition includes one of a drive timing signal and drive voltage.

3. The semiconductor device according to claim 1,
    wherein the first photo sensor comprises:
        a photodiode;
        a first transistor, wherein a gate of the first transistor is electrically connected to a first terminal of the photodiode;
        a second transistor, wherein one of a source and a drain of the second transistor is electrically connected to one of a source and a drain of the first transistor;
        a first wiring electrically connected to the other one of the source and the drain of the first transistor; and
        a second wiring electrically connected to a second terminal of the photodiode, wherein the second wiring is isolated from the first wiring.

4. The semiconductor device according to claim 1, the first photo sensor and the second photo sensor are provided so as to be visible through a same surface.

5. The semiconductor device according to claim 1, wherein the pixel includes a display element including the transistor and the pixel electrode and is capable of taking an image.

6. A semiconductor device comprising:
    a first photo sensor in a pixel;
    a second photo sensor out of the pixel; and
    a controller for setting a drive condition of the first photo sensor in accordance with intensity of light obtained by the second photo sensor;
    wherein the controller includes a first register, a translation table, a CPU, a first memory, a timing controller including a second register, and a power supply circuit including a third register,
    wherein the first register is configured to store first data of the intensity of the light obtained by the second photo sensor;
    wherein the translation table is configured to store data for specifying the drive condition depending on intensity of light,
    wherein the CPU is configured to generate a second data to be stored in the second register and a third data to be stored in the third register by using the first data and the data stored in the translation table, in accordance with a command of a program stored in the first memory,
    wherein the timing controller is configured to generate a drive timing signal of the first photo sensor by using the second data, wherein the power supply circuit is configured to generate drive voltage of the first photo sensor by using the third data, and wherein sensitivity of the first photo sensor is changed in accordance with the drive timing signal and the drive voltage.

7. The semiconductor device according to claim 6, wherein the first photo sensor comprises:
   a photodiode;
   a first transistor, wherein a gate of the first transistor is electrically connected to a first terminal of the photodiode;
   a second transistor, wherein one of a source and a drain of the second transistor is electrically connected to one of a source and a drain of the first transistor;
   a first wiring electrically connected to the other one of the source and the drain of the first transistor; and
   a second wiring electrically connected to a second terminal of the photodiode, wherein the second wiring is isolated from the first wiring.

8. The semiconductor device according to claim 6, wherein the first photo sensor includes a semiconductor layer, the semiconductor layer including a first region including an impurity element which imparts n-type conductivity and a second region including an impurity element which imparts p-type conductivity, and
wherein the first region and the second region are over and in contact with a same surface.

9. The semiconductor device according to claim 6, the first photo sensor and the second photo sensor are provided so as to be visible through a same surface.

10. The semiconductor device according to claim 6, further comprising:
    a transistor in the pixel, wherein the transistor is electrically connected to a pixel electrode; and
    a light-blocking film overlapping with the first photo sensor and the transistor.

11. The semiconductor device according to claim 6, wherein the power supply circuit includes a D/A converter and an amplifier, and
wherein the power supply circuit is configured to generate the drive voltage by converting the third data into output voltage by the D/A converter and amplifying the output voltage by the amplifier.

12. The semiconductor device according to claim 6, wherein the pixel includes a display element and is capable of taking an image.

13. A semiconductor device comprising:
    a first photo sensor in a pixel;
    a second photo sensor out of the pixel; and
    a controller for setting a drive condition of the first photo sensor in accordance with intensity of light obtained by the second photo sensor;
    wherein the controller includes a first register, a translation table, a CPU, a first memory, a second memory, a timing controller including a second register, and a power supply circuit including a third register,
    wherein the first register is configured to store first data of the intensity of the light obtained by the second photo sensor;
    wherein the translation table is configured to store data for specifying the drive condition depending on intensity of light,
    wherein in accordance with a command of a program stored in the first memory, the CPU is configured to execute the program by using the second memory to generate a second data to be stored in the second register and a third data to be stored in the third register by using the first data and the data stored in the translation table,
    wherein the timing controller is configured to generate a drive timing signal of the first photo sensor by using the second data,
    wherein the power supply circuit is configured to generate drive voltage of the first photo sensor by using the third data, and
    wherein sensitivity of the first photo sensor is changed in accordance with the drive timing signal and the drive voltage.

14. The semiconductor device according to claim 13, wherein the first photo sensor comprises:
    a photodiode;
    a first transistor, wherein a gate of the first transistor is electrically connected to a first terminal of the photodiode;
    a second transistor, wherein one of a source and a drain of the second transistor is electrically connected to one of a source and a drain of the first transistor;
    a first wiring electrically connected to the other one of the source and the drain of the first transistor; and
    a second wiring electrically connected to a second terminal of the photodiode, wherein the second wiring is isolated from the first wiring.

15. The semiconductor device according to claim 13, wherein the first photo sensor includes a semiconductor layer, the semiconductor layer including a first region including an impurity element which imparts n-type conductivity and a second region including an impurity element which imparts p-type conductivity, and
wherein the first region and the second region are over and in contact with a same surface.

16. The semiconductor device according to claim 13, the first photo sensor and the second photo sensor are provided so as to be visible through a same surface.

17. The semiconductor device according to claim 13, further comprising:
    a transistor in the pixel, wherein the transistor is electrically connected to a pixel electrode; and
    a light-blocking film overlapping with the first photo sensor and the transistor.

18. The semiconductor device according to claim 13, wherein the power supply circuit includes a D/A converter and an amplifier, and
wherein the power supply circuit is configured to generate the drive voltage by converting the third data into output voltage by the D/A converter and amplifying the output voltage by the amplifier.

19. The semiconductor device according to claim 13, wherein the pixel includes a display element and is capable of taking an image.

* * * * *